(12) United States Patent
Suenaga

(10) Patent No.: US 7,256,468 B2
(45) Date of Patent: *Aug. 14, 2007

(54) LIGHT EMITTING DEVICE

(75) Inventor: Ryoma Suenaga, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/123,109

(22) Filed: May 6, 2005

(65) Prior Publication Data

US 2005/0194601 A1 Sep. 8, 2005

Related U.S. Application Data

(62) Division of application No. 10/475,001, filed as application No. PCT/JP02/03759 on Apr. 16, 2002, now Pat. No. 7,019,335.

(30) Foreign Application Priority Data

Apr. 17, 2001 (JP) .......................... P 2001-118568
Jan. 31, 2002 (JP) .......................... P 2002-024208

(51) Int. Cl.
*H01L 31/0203* (2006.01)
(52) U.S. Cl. .................................................... 257/434
(58) Field of Classification Search .......... 257/99–100, 257/433–435, 81, E33.001
See application file for complete search history.

(56) References Cited

U.S. PATENT DOCUMENTS 5,973,337 A * 10/1999 Knapp et al. ................. 257/99
6,031,253 A * 2/2000 Kobayashi ..................... 257/99
6,034,424 A * 3/2000 Fujimura et al. ............. 257/696
6,365,920 B1 * 4/2002 Abramov et al. ............. 257/81
6,552,368 B2 * 4/2003 Tamai et al. .................. 257/98
6,831,305 B2 * 12/2004 Yasukawa et al. ............ 257/99
2003/0098460 A1 * 5/2003 Yasukawa et al. ............ 257/99

FOREIGN PATENT DOCUMENTS

| JP | 51-113375 U | 9/1976 |
|----|-------------|--------|
| JP | 60-106356 U | 7/1985 |
| JP | 4-25257 U | 2/1992 |
| JP | 2000-058924 A | 2/2000 |
| JP | 2000-252524 A | 9/2000 |

* cited by examiner

*Primary Examiner*—Nathan W. Ha
(74) *Attorney, Agent, or Firm*—Birch, Stewart, Kolasch & Birch, LLP

(57) ABSTRACT

A light emitting device comprises a light emitting element, a metal package having a recess part for housing the light emitting element and a base part which has one or more through holes, and one or more lead electrode pins which penetrate the through holes and are separated from the through holes by an insulating member respectively. The bottom faces of the lead electrode pins project out from the bottom face of the base part and are positioned on a same plane including an outer bottom face of the recess part. With this configuration, the light emitting device has a good heat radiating characteristic and high mechanical strength.

17 Claims, 15 Drawing Sheets

LIGHT EMITTING DEVICE

This application is a divisional of application Ser. No. 10/475,001 filed on Oct. 16, 2003 now U.S. Pat. No. 7,019,335 and for which priority is claimed under 35 U.S.C. § 120. Application Ser. No. 10/475,001 is the national phase of PCT International Application No. PCT/JP02/03759 filed on Apr. 16, 2002 under 35 U.S.C. § 371. The entire contents of each of the above-identified applications are hereby incorporated by reference. This application also claims priority of Application No. 2001-118458 filed in Japan on Apr. 17, 2001 under 35 U.S.C. § 119 and Application 2002-024208 filed in Japan on Jan. 31, 2002.

TECHNICAL FIELD

The present invention relates to light emitting devices which are utilized as kinds of light sources for backlights, displays and lightings, and particularly relates to light emitting devices having high reliability.

BACKGROUND ART

Recently, a high luminance and high power light emitting semiconductor device, and a small sized and high sensitivity light emitting device are developed and are utilized in various fields. Such light emitting devices are utilized, for example, to make light sources of heads for the light printer, light sources for backlights of the liquid crystal displays, light sources for kinds of meters, sensors for kinds of reading, etc.

Such a light emitting device is shown in FIG. 13 as an example. The plastic package 35 which has a recess and lead electrodes 32 is used and an LED chip 31 is mounted (die bonding) on the exposed surface of one lead electrode 32. The electrodes of the LED chip 31 are bonded to the lead electrode 32 by gold wires 34, respectively. The LED chip mounted in the recess is sealed with a transparent molding resin 39. With this configuration, the light emitting devices having very high reliability can be obtained.

However, such light emitting devices will be required to withstand more severe environment as their applications expand. The light emitting devices in air planes and automobiles are subjected to low-temperature conditions lower than −20° C. or high temperature conditions higher than +80° C. and are subjected to thermal shock or changed pressures. In such cases, the intensity or the directivity of the light outputted from the device is changed by exfoliation of the LED chip from the die-bonding resin generated by expanding and contraction of the mold resin. The light then disappears completely by the breaking of the wire at worst.

In the light emitting element, the heat is generated by the consumption of electricity. The heat generated by the light emitting element may be transmitted through the lead electrodes to the substrate in the light emitting devices.

However, that heat radiation is not enough. Therefore, the speed of response (operation) of the element and the resin covering the element deteriorate by raising the temperature of the light emitting element arose from insufficiently heat radiation.

To avoid such problems, the can-type packages are used conventionally.

For example, a stem shown in FIG. 12 is used in a conventional light emitting device. The stem has a convex metal base 40 and lead electrode pins 32 penetrating the through halls of the metal base 40 so as to seal by an insulating material 33(for example glass). The light emitting element 31 is connected on the stem electrically and hermetically sealed with can 41 having a flange 36 in bottom side and a window 37.

Such light emitting devices can prevent the wires from disconnecting and have high reliability, good moisture resistance, good heat radiation characteristic and good thermal stability, since the packages are made of metal and have hollow structure.

However, surface mounting type light emitting devices are required instead of the lead type light emitting devices recently, as thin-sizing and small-sizing advance to respond to the requirements of high density assembly.

DISCLOSURE OF INVENTION

It is an object of the invention to provide a thin surface mounting type light emitting device which has high reliability and capable of emitting the light with high intensity.

The light emitting device according to an aspect of the present invention comprises a light emitting element, a metal package having a recess part for housing the light emitting element and a base part which has one or more through holes, one or more lead electrode pins which penetrate the through holes and are separated from the through holes by a insulating member respectively. In the light emitting device, the bottom faces of the lead electrode pins project out from the bottom face of the base part and are positioned on the same plane including an outer bottom face of the recess part. With this configuration, the light emitting device which has a good mountability (can be mounted easily) and high reliability can be obtained.

It is preferable that the upper faces of the lead electrode pins project out from the upper face of the base part to improve the accuracy in bonding positions.

The thickness of the base part is thicker than the thickness of the recess part. With this configuration, the light emitting devices which have both high heat radiation characteristic and high mechanical strength and which are produced with high yield can be obtained.

Moreover, it is preferable that the inner wall is tapered wall so as to improve the outputting efficiency of the light emitted from the light emitting element.

The light emitting device according to an aspect of the present invention further comprises a transparent sealing member covering the light emitting element in the recess. The transparent sealing member includes phosphor material capable of emitting light having a wavelength different from that of the light emitted from the light emitting element by absorbing the light emitted from the light emitting element.

In the present invention, since the recess part of the metal package has a recess having minimum volume as far as capable of housing the light emitting element and a good heat radiation characteristic, a large current can be flowed even if an organic substance is used as a transparent sealing member. The color conversion type light emitting device which has high reliability and is capable of emitting the light with high intensity can be obtained by covering the light emitting element with the transparent sealing member.

The light emitting device according to an aspect of the present invention further comprises a lid composed of a metal part and a transparent window part on the metal package, the transparent window part opposing to the recess and being crossed a line extended from an inner wall of the recess. With this configuration, the light from the light emitting element is reflected by the inner wall of the recess, so the light can be outputted efficiently.

The metal package has a thermal conductivity in a range from 10 W/m·K to 100 W/m·K and a thermal expansion coefficient in a range from $0.05 \times 10^{-4}$/deg to $0.20 \times 10^{-4}$/deg. With these ranges, the light emitting device in which the large current can be flowed without spoiling the reliability can be obtained.

The recess part has a brim part projecting from the base part. With this configuration, the light outputting efficiency is more improved, since the main surface of the package can be used effectively.

The transparent window part is crossed a line that links a rising edge point of the wall of the recess and an ending edge point of the wall of the recess, the ending edge point and the rising edge point facing each other with the light emitting element between. With this configuration, the light of which direction is changed by reflecting by the inner wall can be outputted.

Another light emitting device according to an aspect of the present invention comprises a light emitting element, a metal package having a thin part for mounting the light emitting element and a thick part which elongates from the thin part to outside. The thick part is provided with one or more lead electrode pins integrally which are separated from the thick part by an insulating member. In the light emitting device, the bottom faces of the lead electrode pins project out from the bottom face of the thick part and are positioned on the same plane including an outer bottom face of the thin part. With this configuration, the heat generated by the light emitting element is radiated efficiently from the thin part which has a small heat resistance.

The thin part is parallel to the thick part and a boundary part between the thin part and the thick part is bent. With this configuration, the heat radiating characteristic is improved by the difference in heat resistance between the thin part and the thick part.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

The preferred embodiments are described referring to Figures.

Figure 5:
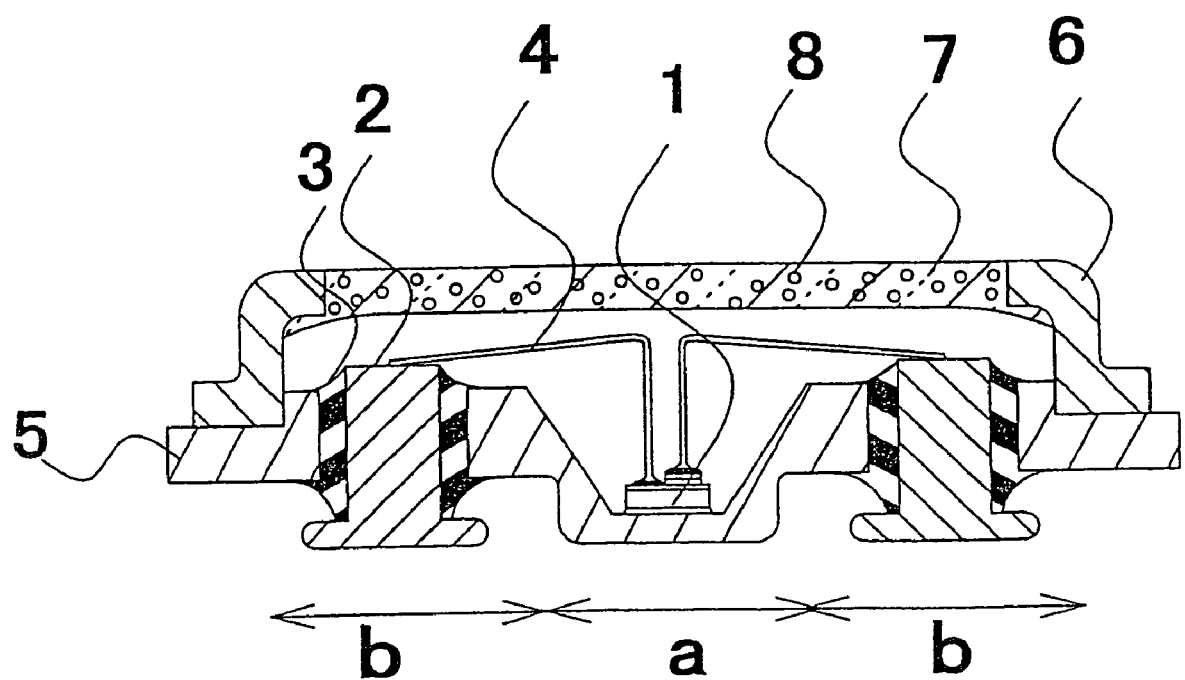
FIG. 5 is a schematic sectional view of another light emitting device of the present invention.

FIG. 5 shows a light emitting device of one embodiment according to the present invention.

Referring to FIG. 5, a package 5 is made of metal and has a recess part (a) at the central part thereof for housing a light emitting element. A base part (b) surrounding the recess part has two through holes formed on both sides of the recess part. The lead electrode pins 2 have been inserted in the through holes so as to be insulated from the base part by an insulating member 3 (hard glass).

The both ends of each lead electrode pin 2 project from the surfaces of the base part. The bottom faces of the lead electrode pins are positioned on the same plane including an outer bottom face of the recess part. In this specification, the main faces means the surfaces positioned on the side of opening of the recess. The surfaces opposed to the main faces are expressed as a rear face or a bottom face.

On the side of the main face of the metal package 5, an LED chip 1 (light emitting element) is mounted in the recess and the electrodes of the LED chip are connected to the lead electrode pins electrically, respectively, via wires 4. The package 5 provided with the LED chip is hermetically sealed by a lid 6 having a transparent window 7.

The transparent window 7 may include the kinds of phosphor materials 8 (inorganic phosphor materials or organic phosphor materials). For example, the phosphor material 8 is a phosphor including one or more rare earth elements. The phosphors of garnet structure which include at least one element selected from the group consisting of Y, Lu, Sc, La, Gd and Sm, and at least one element selected from the group consisting of Al, Ga and In can be given. Specially, it is preferably to use an yttrium-aluminum oxide phosphor activated by cerium. The yttrium-aluminum oxide phosphor activated by cerium may include one or more selected from the group consisting of Tb, Cu, Ag, Au, Fe, Cr, Nd, Dy, Ni, Ti, Eu and Pr. The phosphor material 8 is capable of emitting the light having a wavelength different from that of the light emitted from the light emitting element by absorbing a part of the light emitted from the light emitting element. The light emitting devices which are constituted by parts made of the inorganic materials may have an extremely high reliability, since the parts can be prevented from deteriorating the quality by the heat and the light.

In the embodiment of present invention, the parts are constituted as follows.

<Light Emitting Element 1>

It is to be understood that the invention is not limited to the specific light emitting element. However, in the light emitting devices with phosphor, the light emitting element preferably should be a semiconductor light emitting element which has an active layer capable of emitting a light having a luminescence spectrum which can excite the phosphor. The various semiconductors such as ZnSe and GaN can be given as the material of such semiconductor light emitting element. The nitride semiconductors ($In_XAl_YGa_{1-X-Y}N$, $0 \leq X$, $0 \leq Y$, $X+Y \leq 1$) which can emit the light with short wavelength capable of exciting the phosphor efficiently are more preferably given. The nitride semiconductors may contain Boron (B) and/or Phosphorus(P). There are a homojunction structure, a heterojunction structure and a double heterojunction structure which have MIS junction, PIN junction and PN junction as a laminating structure. A luminescence wave length can be variously selected by the material of semiconductor layers and mix crystal ratio.

The active layer may have a single quantum well structure or a multi quantum well structure in which a semiconductor active layer was formed to be a thin film which generates quantum effect.

When the nitride semiconductor is used, materials such as sapphire, spinel, SiC, Si, ZnO, GaAs and GaN are preferably used for a substrate. The sapphire substrate is preferably used for forming the nitride semiconductor having good crystallinity by mass production. The nitride semiconductor can be formed on the sapphire substrate using a MOCVD method and the like. In this case, a buffer layer made of GaN, AlN, GaAlN or the like is grown on the sapphire substrate, and then the nitride semiconductor having a p-n junction is formed on the buffer layer.

As an example of the light emitting element which has a p-n junction using the nitride semiconductor, there is a light emitting element having a double hetero-structure in which the first contact layer of n-type nitride semiconductor, the first clad layer of n-type Aluminum gallium nitride semiconductor, an active layer of Indium gallium nitride semiconductor, a second clad layer of p-type Aluminum gallium nitride semiconductor, and a second contact layer of p-type gallium nitride semiconductor are laminated in order on the buffer layer.

A nitride semiconductor exhibits n-type electroconductivity in a condition in which it is not doped. However, it is preferable to set the carrier concentration of the respective layers within a desired range for improving the luminescence efficiency. It is preferable to appropriately introduce Si, Ge, Se, Te, C and the like as n-type dopant for forming a desired n-type nitride semiconductor in which the carrier concentration is controlled. On the other hand, when p-type nitride semiconductor is formed, it is preferable to dope Zn, Mg, Be, Ca, Sr, Ba and the like. The nitride semiconductor is hardly made be p-type by only doping the p-type dopant, therefore it is preferable to make it be low resistance by carrying out heating by a furnace, a treatment by plasma irradiation and the like after introduction of the p-type dopant. A light emitting element comprising the nitride semiconductor is prepared by cutting in a chip shape after electrodes have been formed.

In the light emitting device for emitting white light of the present invention, the wavelength of the light emitting element preferably should be set in a range of 400 nm-530 nm, more preferably in a range of 420 nm-490 nm, in consideration of complementary color related to the wavelength of the light emitted from the phosphor and preventing from deterioration of transparent resin.

In the present invention, the package is made of only metal, so the package can be prevented from the deterioration by the ultraviolet light. Therefore, in the present invention, the color conversion type light emitting device of which irregular color is suppressed can be obtained by using the light emitting element, of which main wavelength is in a range of near ultraviolet region or ultraviolet region, combined with the phosphor which absorbs a part of the light emitted from the light emitting element and which emits the light having a wavelength different from that of the light emitted from the light emitting element. In this light emitting device, it is preferably that a resin which is stable to the ultraviolet or the inorganic glass is used for binding the phosphor.

<Metal Package 5>

In the embodiment of the present invention, the metal package 5 includes the recess part (a) for housing the light emitting element and the base part (b) provided with the lead electrode pins 2. The bottom surface of the recess part is positioned on the same plane that includes the bottom surfaces of the lead electrode pins.

The metal package preferably should be made of the thin plate in consideration of small sizing and the efficient radiation of the heat generated by the light emitting element. On the other hand, the contacting area between the metal of the package and the insulating member preferably should be enlarged in order to improve the reliability of the device by softening the difference in thermal expansion between the metal of the package and the insulating member 3. Therefore, the metal package preferably should be made of the thick plate.

Therefore, in the present invention, the package is distinguished into a part for mounting the light emitting element (recess part (a)) and a part for fixing the lead electrode pins (base part (b)) and those shapes and thickness are set accordance with there respective purposes to improve the reliability.

Each parts are described.

<Recess Part (a)>

Figure 15:
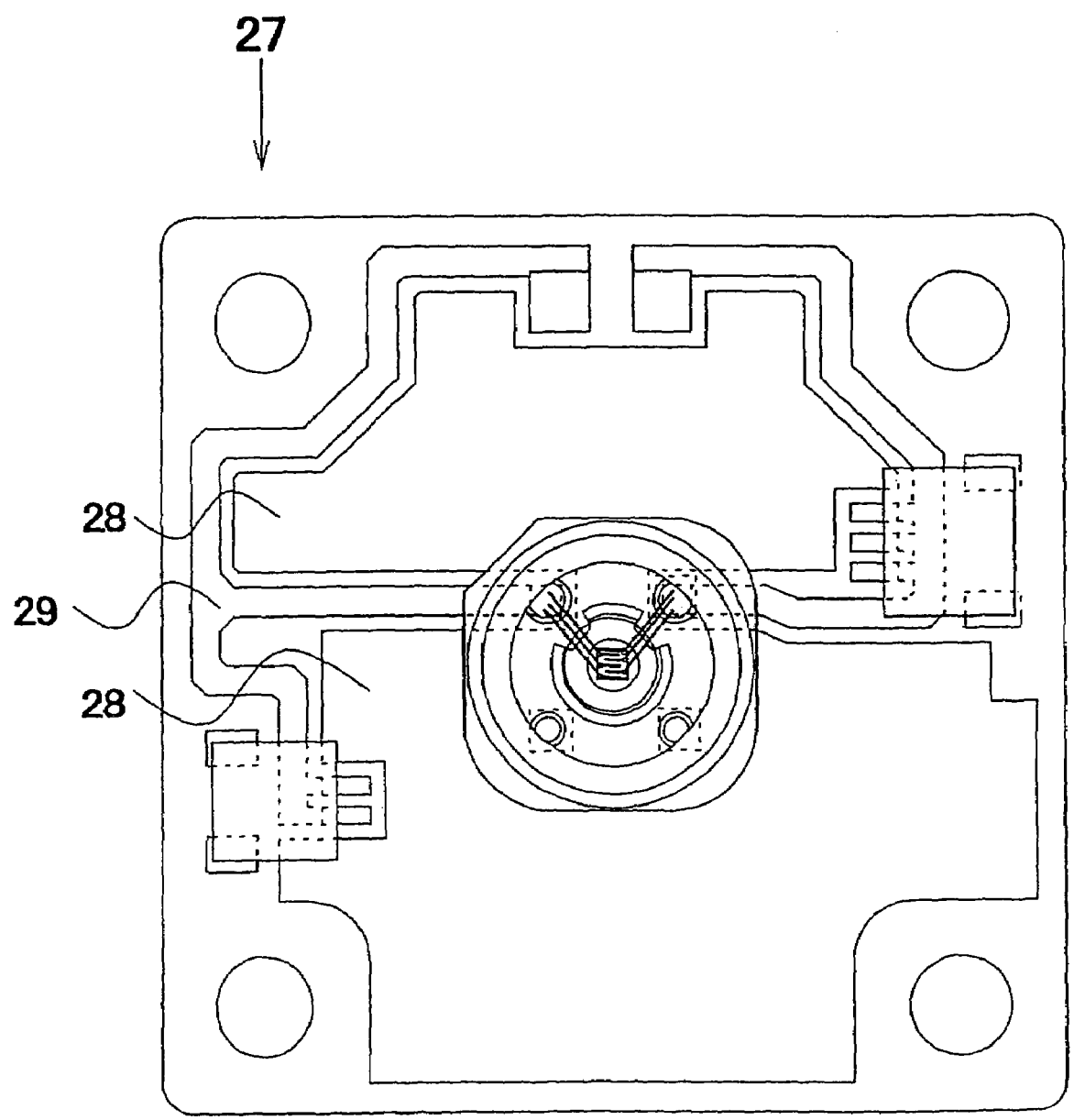
FIG. 15 is a schematic plan view of the light emitting device of the present invention mounted on the low heat resistance substrate.

In the embodiment, the package has a recess part for housing the light emitting element. The recess part is capable of radiating the heat generated by the light emitting element efficiently. The bottom surface of the recess part positioned on the same plane including the bottom surface of the lead electrode pins(mounting surface of the device). Therefore, the bottom surface of the recess part will contact a substrate 27 (FIG. 15) when the device is mounted. In this configuration, the heat generated by the light emitting element can be transmitted to the substrate directly by forming a high heat radiating region 28 distinguished from an electrode 29 and bonding the bottom surface of the recess part (a) of the light emitting device on the high heat radiating region 28 by the conductive member. Therefore, the output power of the light emitting device can be increased, since the current of the light emitting element can be increased. If there is a supporting member on the back surface of the package, the supporting member preferably should be bonded on the high heat radiating region 28 by the conductive member.

Figure 3A:
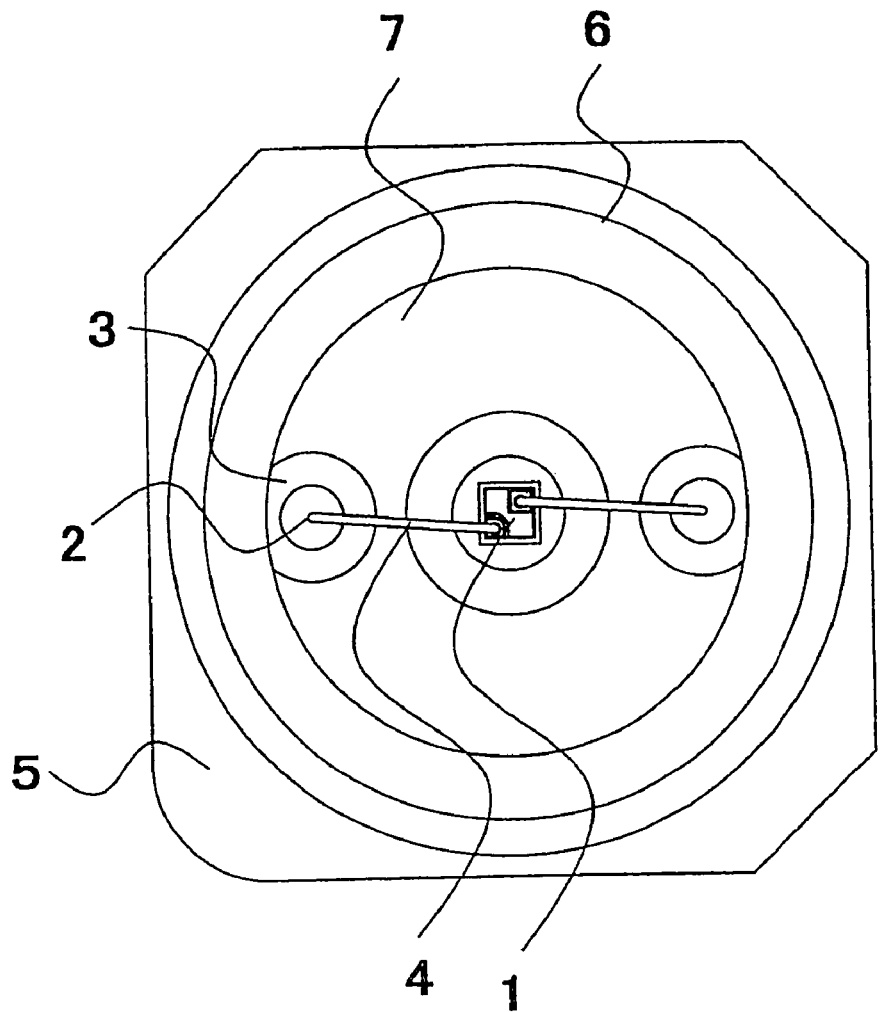
FIGS. 3A and 3B are respectively a schematic plan view and a schematic sectional view of another light emitting device of the present invention.
Figure 3B:
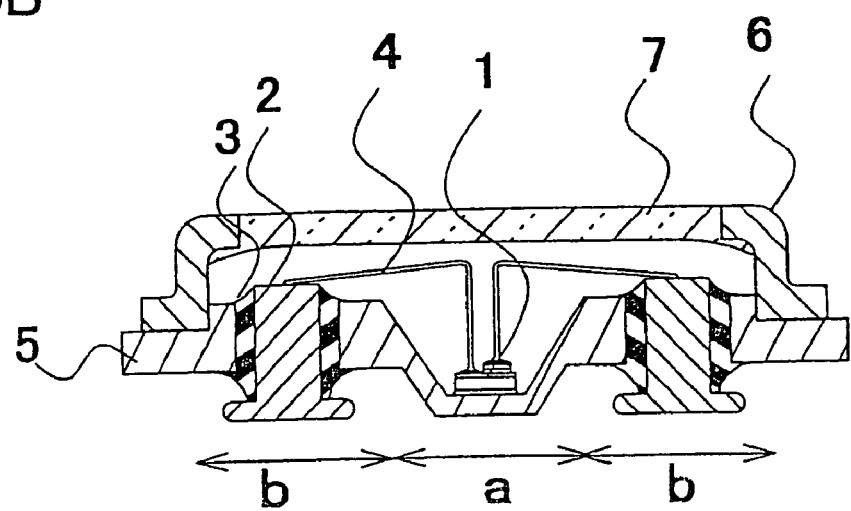

The thickness of bottom part of the recess part (a) is thinner than that of the base part (b) (FIGS. 3A and 3B)

which is the periphery of the package. With this configuration, the heat can be radiated from the thin part (bottom part of the recess part) efficiently by the difference in the heat resistance between the thin part and the thick part which is the base part. The thickness of the thin part preferably should be set from 0.05 mm to 0.2 mm, more preferably from 0.05 mm to 0.1 mm so as to lower heat resistance. With this, in the light emitting device, the heat generated by the light emitting element can be radiated from the lowered heat resistance region with short route directly to the substrate.

The main face of the thin part (bottom part of the recess part) is parallel to the main face of the thick part and the boundary part between the thin part and the thick part is bent (outer surface is bent in the boundary part). With this, the heat radiating efficiency is improved by increasing the difference between the thick part and the thin part. The recess part preferably should be positioned at the center of the light emitting device to obtain the good directional pattern.

The recess preferably should have a volume capable of housing all of the light emitting element. With this, the light emitted from the four side surfaces can be output by being reflected by the inner side walls and the uneven light emitting and the irregular color which are prone to be generated in the light emitting element is improved. In the light emitting device having a color conversion layer so as to transform the wavelength, the color conversion layer easily can be formed so as to cover the light emitting element mounted in the recess. Moreover, it is preferably to form the transparent member into the recess so as to cover the light emitting element in order to improve the output efficiency of the light. In the light emitting device of the embodiment, the light emitting element is covered with the color conversion layer made of the transparent member which includes the phosphor material capable of emitting the light having a wavelength different from that of the light emitted from the light emitting element by absorbing the light emitted from said light emitting element. In the metal package of the present invention, since the recess part radiates the heat efficiently, the color conversion layer can be made of not only inorganic materials but also organic materials. Therefore, in the light emitting device including the organic materials, the good optical characteristics can be obtained, since the organic materials are not deteriorated by the large current operation. The inner wall of the recess preferably should be inclined so that the opening part is broader than the bottom part in the recess. With this, the light emitting device capable of emitting the high luminous light can be obtained.

On the other hand, the back surface (outer surface) of the recess (a) has a convex shape. The groove (hollow) preferably should be formed between the bottom face of the recess part and the bottom faces of the lead electrode pins. Since the hollow prevents from the short circuit between the lead electrode pins, the light emitting device can be mounted with high reliability. If the groove is not formed, there is danger of poor insulation or short circuit between the lead electrode pins by the solder adhered to the adjacent base part.

The recess part (a) is produced, for example, by forging (drawing) a metal plate. In this embodiment, the recess part is formed by drawing so that the metal plate is flowed from the main surface (upper surface) to bottom surface. In this method, since a part of the flowed metal constitutes the bottom of the recess part, an area of mounting surface can be enlarged and the thickness of the part which is a partial side-wall positioned near to the bottom of the recess can be thickened. In the recess part, the thickness of the mounting part (bottom part which has a flat mounting surface of the recess part) for the light emitting element is thinner than the thickness of the partial side-wall (which is surrounding the mounting part) of the recess. With this, the heat radiating characteristic and the mechanical strength of the package can be improved. The light emitting device can be mounted accurately and have a desired directional pattern.

<Base Part (b)>

The expression "base part (b)" as used herein means the plate part of the package 5 which encloses the recess part (a). The base part has one or more through holes penetrating the base part in the thickness direction. The through holes are holes for fixing the lead electrode pins 2. The light emitting device of the embodiment has two through holes formed on both sides of the recess part. The lead electrode pins 2 are inserted in these through holes so as to be insulated from the base part by the insulator, respectively. With this configuration, the light emitting element can be placed in the center of the through holes. Therefore, the light emitting device can have a desired directional pattern.

Figure 2A:
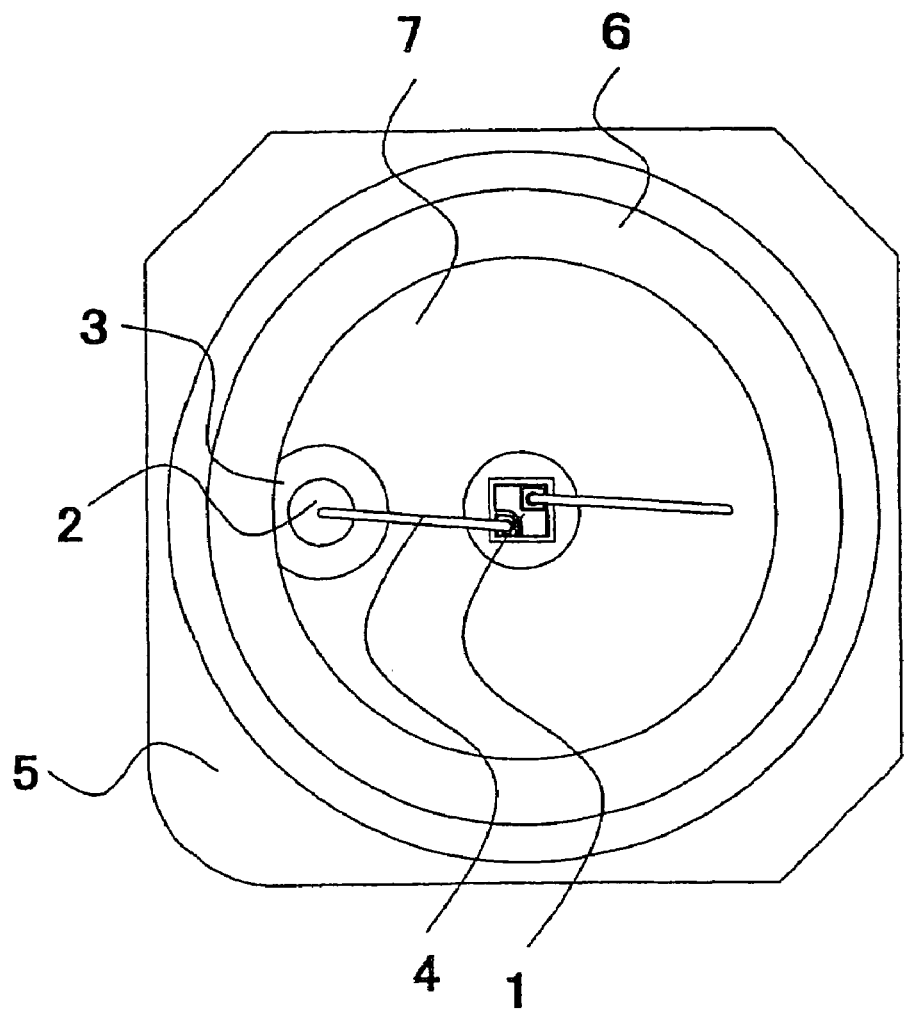
FIGS. 2A and 2B are respectively a schematic plan view and a schematic sectional view of another light emitting device of the present invention.
Figure 2B:
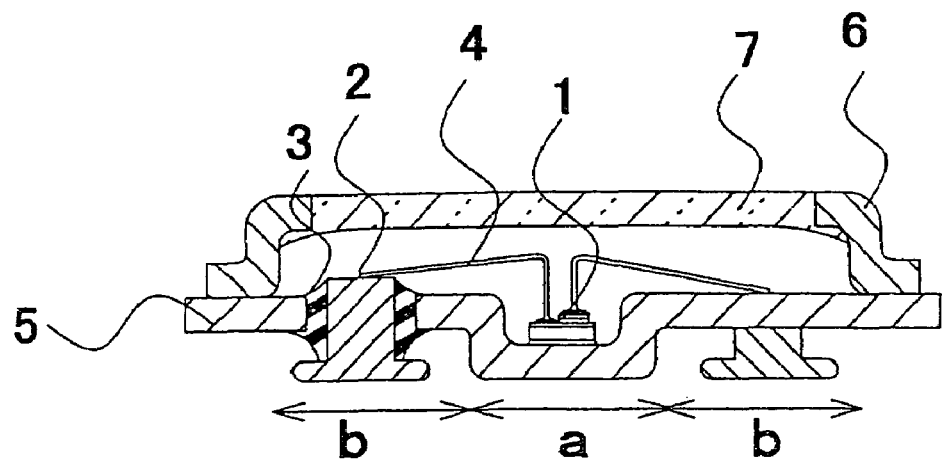

In the light emitting device according to an embodiment of the present invention, one of the cathode and anode lead electrode pins may be inserted so as to be insulated by the insulator and the other lead electrode pin may be formed monolithically with the base part, as shown in FIGS. 2A and 2B. With this configuration, the recess part and the other electrode pin are made of a continuous metal without the insulating materials in the package, so the heat generated by the light emitting element is radiated from the back face (including the bottom surface of the recess part and the bottom surface of the other electrode pin) of the package efficiently.

In the present invention, the thickness of the base part preferably should be thicker than bottom part of the recess part in the package. The thickness of the base part is preferably in a range of 0.3 mm-1.0 mm and preferably in a range of 0.5 mm-1.0 mm. If this thickness is less than 0.3 mm, the mechanical strength degrades. The lack of the sufficiently mechanical strength brings the fear of generating the cracks at the welded boundary between the package and the lid by the stress strain during welding. The reliability is also degraded by corrosion of the wire and the light emitting element, when the water permeates into the package caused by the lack of gastightness. If the thickness exceeds 1.0 mm, the pulsed current is hard to flow in the welded boundary and sealing is impaired. The cost of the light emitting device increases as the thickness of the lighting emitting device increases.

The base part (b) preferably should have a flange at an outer edge thereof. With this configuration, the lid 6 can be positioned easily on the package by contacting the inner wall of the lid and the vertical surface linked to the root of the flange, and the productivity can be improved.

The supporting member may be formed on the back surface of the package. The supporting member preferably should be positioned between the lead electrode pins at an equally spaced position to improve the mounting stability. The supporting member preferably should be made of the same material as the base part to radiate the heat efficiently. For example, such support member is made easily by pressing the base part from the main face in the direction of the back surface so as to expand the metal.

The thermal conductivity of the lead electrode pins and the thermal conductivity of the metal package are preferably in a range of 10 W/m·K-100 W/m·K, more preferably in a range of 15 W/m·K-80 W/m·K, most preferably in a range of 15 W/m·K-50 W/m·K. With these ranges, the light emitting devices which are capable of flowing the large current for a long time without deterioration of the reliability can be obtained.

Each thermal expansion preferably should be in a range of from $0.05 \times 10^{-4}$/deg to $0.20 \times 10^{-4}$/deg.

The thermal expansion of the metal package preferably should be the same as or more than the thermal expansion of the insulating material. If the thermal expansion of the metal package is the same as that of the insulating material, the metal package and the insulator are bonded by thermocompression without damages to both members. In the latter case, if the difference in the thermal expansion between the metal package and the insulating material is less than $0.01 \times 10^{-4}$/deg, the damages can be avoided by enlarging the contacted area between the metal package and the insulating material. The through holes of the metal package contract so that the insulating member is tightened moderately by the difference in the thermal expansion. Therefore, the insulating member can be fixed tightly to the metal package without forming an oxide layer on the inner surface of the through holes. With this, the production process can be simplified, so the productivity can be increased.

The material of the metal package preferably should have a high mechanical strength in order to make a thin package with high reliability. Concretely, the metal package preferably should be made of covar or iron. The covar which is an alloy of Fe—Ni—Co has the thermal expansion nearly equal to that of the low-melting glass. Therefore, high quality hermetic sealing can be obtained by using the covar. These materials preferably should be plated with Ag. The reflectance and scattering ratios of the surface of the package are improved by the Ag plating. The adherence between the light emitting element, wires, lid and the package can be increased too, since the Ag plating layer has a function as a brazing metal for welding. Moreover, these effects can be more improved by forming the Ag layer on the main face so as to have a good gloss part for reflecting and a mat part for bonding to comply with the purposes respectively.

The light emitting device of low cost and high reliability can be obtained by using the metal package above-mentioned.

<Lead Electrode Pins>

The light emitting device of the present invention has cathode and anode lead electrode pins 2. At least one of the cathode and anode lead electrode pins is fixed with the base part so as to be insulated by the insulator monolithically. For example, the base part (b) provides with the through hole and the one lead electrode pin is inserted in the through hole so as to be insulated by the insulator. The top end of one lead electrode pin projects out from the upper surface of the base part and the bottom face of the base part is positioned on the plane including the bottom face (on the side of mounting surface) of the recess part.

The upper face of the lead electrode pins 2 for wire bonding preferably should have an area in a range of 0.02 mm$^2$-0.2 mm$^2$, more preferably in a range of 0.05 mm$^2$-0.15 mm$^2$. With these range, a wire can be bonded accurately and a small sized light emitting device can be obtained.

If the bottom face (on the side of mounting surface) of the lead electrode pins projects from the bottom surface of the base part, the bottom faces of the lead electrode pins may have an area larger than that of the upper face. In the case that the bottom faces of the lead electrode pins have an area larger than that of the upper face, the light emitting device can be mounted stably by the bottom faces and the heat radiating can be improved by contacting with the printed circuit board with wide area. The lead electrode pins having such configurations may be produced by pressing the bottom end of the column-like shaped electrode pin. The configuration of the lead electrode pin on the side of the bottom face preferably should be an inverse T shaped, a broadened shaped toward its bottom, an inverse taper shaped in its cross section.

<Lid 6>

The light emitting device of the present invention has the lid 6 having the transparent window 7 and a metal part on the main surface of the metal package. The transparent window 7 for outputting the light preferably should be positioned in the center of the lid 6.

In the embodiment, the transparent window 7 is located above the light emitting element mounted in the recess of the metal package, and the transparent window 7 is crossed the line extended from the inner wall of the recess. The light emitted from the edge of the light emitting element is reflected or scattered on the side wall of the recess toward the front direction and is output. The range of directions of the reflected or scattered lights is limited in a region surrounded by the lines (plane) extended from the inner wall of the recess. Therefore, according to the embodiment, the reflected or scattered lights are gathered to the transparent window efficiently, so the light emitting device is capable of emitting the light with a high luminance.

The material of the lid preferably should have a thermal expansion which is nearly equal to that of the package and the transparent material of the window. The surface of the lid preferably should be covered with Ni plated layer.

In the lid, the transparent member may be sealed hermetically by firing a lid base and a glass tablet supported in the opening of the lid base with a carbon fixture.

The lid needs to have a smooth face capable of close adherence to the welding part of the package for hermetically sealing. When the lid has a convex shaped configuration, the color conversion member is easily formed on the rear face of the window of the lid and the light emitting device can be produced with high yield rate.

The light emitting device capable of withstanding thermal stress can be obtained by injecting a flexible member into the inner side of the convex part so as to cover the light emitting element mounted in the recess monolithically.

Figure 7:
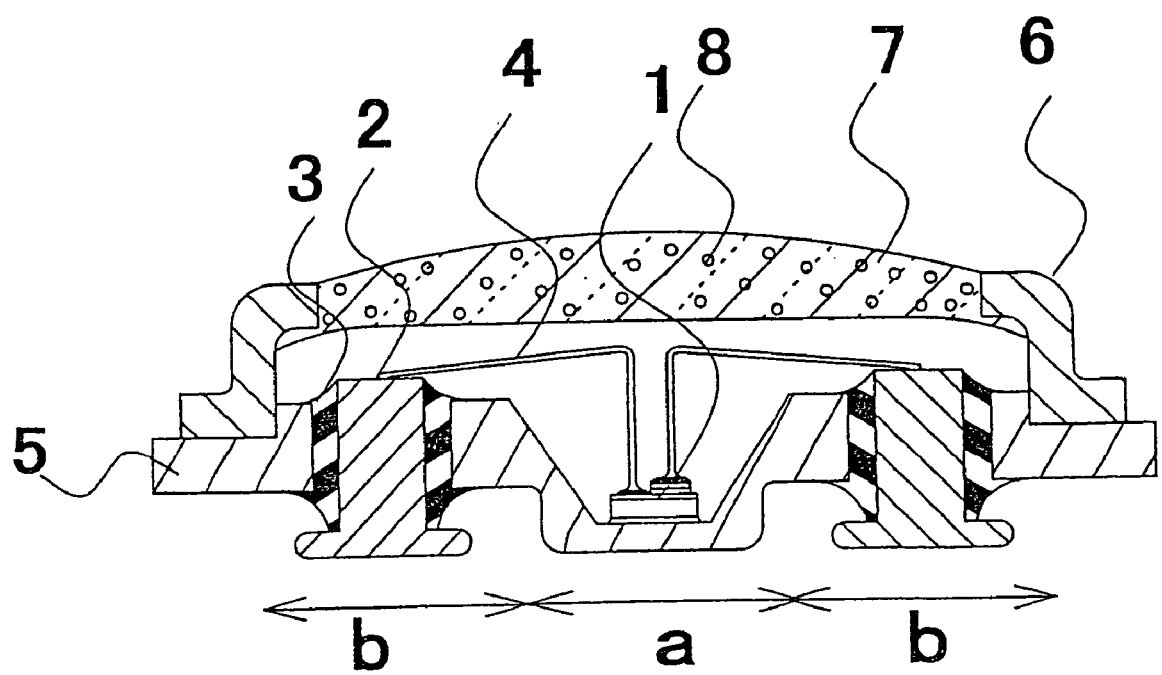
FIG. 7 is a schematic sectional view of another light emitting device of the present invention.

Moreover, when the outer surface of the window part is a convex lens shaped as shown in FIG. 7, the light emitting device of which light is condensed in the front direction can be obtained. For example, in a case that a blue LED chip mounted in the metal package is covered with a shell shaped lens of which directional angle is set to 45° and of which the rear surface is covered with a phosphor material capable of emitting the yellow light by absorbing the part of the light emitted from the blue LED chip, a small sized light emitting device capable of emitting a white light beam by mixing the blue light and the yellow light can be obtained. Such light emitting device can be used as a flashbulb for portraying, for example, in the portable telephone.

<Phosphor Material 8>

The light emitting device of present invention may include the phosphor material 8 capable of absorbing a part of the light emitted from the light emitting element and emitting the other light for emitting a light having a desired color tone. The light emitting device of the present invention may include the other member such as a diffusing material and a pigment instead of or with the phosphor material. For example, the other member may be included in the window part of the lid or may be applied on the inner surface of the window part with binder.

The phosphor materials in the embodiment will be described in detail, hereinafter.

The phosphor material of the embodiment is a phosphor based on the yttrium-aluminum oxide phosphor activated by cerium, which is capable of emitting by being excited by the light emitted from the semiconductor light emitting element having an active layer of nitride semiconductor. Examples of the phosphor based on the yttrium-aluminum oxide phosphor include $YAlO_3$:Ce, $Y_3Al_5O_{12}$:Ce(YAG:Ce), $Y_4Al_2O_9$:Ce and the mixture thereof. The yttrium-aluminum oxide phosphor may include at least one selected from the group consisting of Ba, Sr, Mg, Ca and Zn. Moreover, if the phosphor contains Si, the phosphor particles sizes will be uniform, since Si prevent from the crystal growth.

The yttrium-aluminum oxide phosphor activated by cerium should be interpreted in a wide sense including a phosphor of which yttrium(Y) is partially or entirely replaced by at least one selected from the group consisting of Lu, Sc, La, Gd and Sm and a phosphor of which aluminum(Al) is partially or entirely replaced by at least one selected from the group consisting of Ba, Tl, Ga, In.

In detail, a phosphor represented by the general formula $(Y_zGd_{1-z})_3Al_5O_{12}$:Ce($0<z\leq1$) and a phosphor represented by the general formula $(Re_{1-a}Sm_a)_3Re'_5O_{12}$:Ce($0\leq a<1$, $0\leq b\leq 1$, Re is at least one of Y, Gd, La, and Sc; Re' is at least one of Al, Ga, and In) are given as concrete examples of the yttrium-aluminum oxide phosphor.

Since the phosphors have a garnet structure, the phosphors have an excellent thermal stability, an excellent light resistance and an excellent moisture resistance and the exciting spectrum peaks of the phosphors can be set about 450 nm. Moreover, the phosphors have emission spectrums which have a peak of about 580 nm and wide range extending to about 700 nm.

The exciting and emitting efficiencies of the phosphors in the wavelength range more than 460 nm can be increased by including Gadolinium(Gd) in the crystal. The peak wavelength is shifted to a longer wavelength with increasing contents of Gd and the spectrum is shifted to a longer wavelength as a whole with increasing contents of Gd. Reddish emission color will be obtained by increasing contents of Gd. The emission intensity by a blue light tend to decrease with increasing contents of Gd. The phosphor may include one or more selected from the group consisting of Ta, Cu, Ag, Au, Fe, Cr, Nd, Dy, Co, Ni, Ti and Eu.

In the yttrium-aluminum phosphor having a garnet structure, the emission wavelength is shifted to a shorter wavelength by substituting Ga for a part of Al and the emission wavelength is shifted to a longer wavelength by substituting Gd by a part of Y.

In the case that a part of Al is substituted by Ga, the substitution ratio of Al by Ga preferably should be less than 0.1 and the contents of Ce preferably should be set in a range of 0.03-1.0. In the case that the substitution ratio of Al by Ga is less than 0.2, a component of Red color is decreasing and a component of Green color is increasing. However, since the deficiency of the component of Red color can be compensated by increasing a contents of, Ce, the desired color is obtained without reducing the brightness. With these compositions, the temperature coefficient and the reliability of the light emitting device can be improved. The light emitting device capable of emitting the light of neutral color(for example pink) can be obtained by using a phosphor of which composition is set so as to emit the light having a component of Red color more than the other components.

The phosphor comprises Y, Gd, Al and Ce and the oxides thereof or the compounds thereof capable of changing the oxides in high temperature are mixed fully with predetermined stoichiometric ratios to prepare the mixed raw materials for producing the phosphor. Alternately, the mixed raw materials are prepared by mixing the aluminum oxide and the coprecipitation oxide made by firing the sludge coprecipitated from an acid solution in which Y, Gd, Ce are dissolved with oxalic acid. The mixtures of the mixed raw materials and fluoride such as barium fluoride and ammonium fluoride which act as a flux are fired in a crucible at a temperature from 1350° C. to 1450° C. during from 2 hours to 5 hours. The fired mixture is crushed in a ball mill and sieved after washing and drying.

In the present invention, the phosphor including two or more kinds of yttrium-aluminum garnet phosphors activated by cerium or the other phosphors may be used.

In the present invention, the particle sizes preferably should be in a range from 10 µm to 50 µm, more preferably in a range from 15 µm to 30 µm. Since the phosphor particles of which particle sizes are less than 15 µm tend to consolidate and tend to settle densely in a liquid resin, the transmitting efficiency of a light decrease. In the light emitting device of the present invention, the output power of the light emitted from the device can be improved, since the light is not screened by the condensed particles in the resin by setting the particle sizes of the phosphor in the aforementioned ranges. In the present invention, the phosphor of which particle sizes set in the aforementioned ranges has a high absorbing rate, a high converting rate and a wide range exciting wavelength. Therefore, in the light emitting device including the large sized phosphor of which particle sizes is set in the aforementioned ranges, not only the light of peak wavelength but also the light of around the peak wavelength which are emitted from the light emitting element can be converted efficiently and the productivity of the device can be improved.

Particle size distribution of the phosphor used in the present invention is shown by the volume-based distribution curve. The volume-based distribution curve is drawn by measuring the particle size distribution of the phosphor material by laser diffraction and scattering method. Specifically, the material is dispersed in an aqueous sodium hexametaphosphate solution having a concentration of 0.05% and the particle size distribution is measured with a laser diffraction particle size distribution measuring instrument (SALD-2000A) over a range from 0.03 to 700 µm in an atmosphere of 25° C. in temperature and 70% in humidity.

According to the present invention, median particle size of the phosphor material refers to the particle size at which the cumulative percentage reaches 50 vol % in the volume-based distribution curve, and this value is preferably within a range from 15 to 50 µm. It is also preferable that the phosphor material includes the particles of this median size with a high concentration, preferably from 20% to 50 vol % (distribution frequency). The light emitting diode having good contrast with irregular color suppressed can be obtained by using the phosphor material made up of particles having less variation in size as described above.

Figure 6:
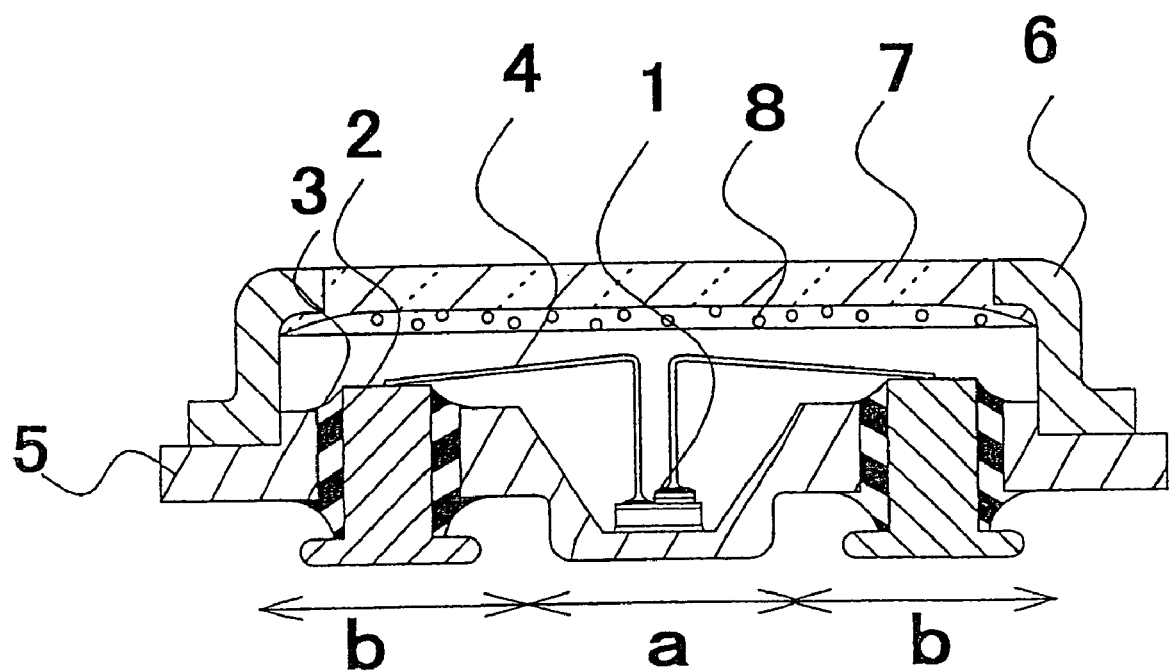
FIG. 6 is a schematic sectional view of another light emitting device of the present invention.
Figure 8:
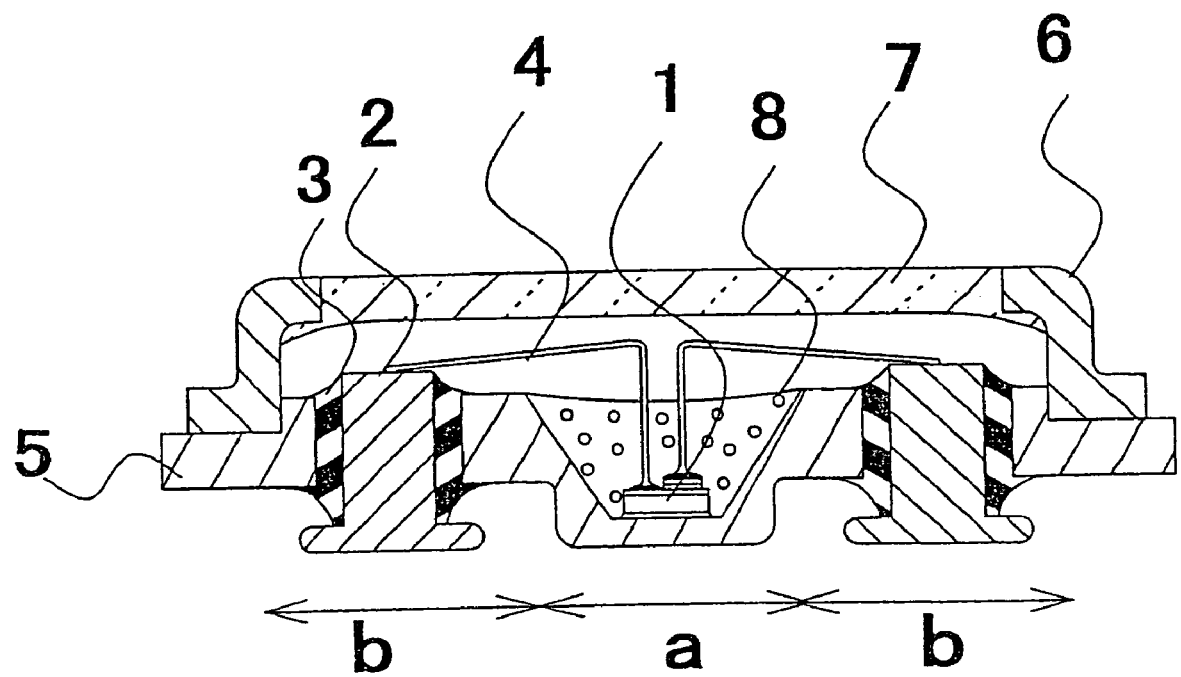
FIG. 8 is a schematic sectional view of another light emitting device of the present invention.

It is to be understood that the present invention is not intended to be limited to a position of the phosphor material. The phosphor material may be bound on the rear surface (FIG. 6) or may be included in the window of the lid by mixing the phosphor material in the material for the window. The phosphor material may be included in the resin which is superior in thermal stability or inorganic material (such as a glass) for covering the light emitting element in the recess of the package (FIG. 8). Even if the resin including the phosphor material covers the light emitting element in the recess, the resin and the phosphor material can be made full use of their characteristic without deterioration by heat, since the package is superior in thermal radiating characteristic.

For example, the window including the phosphor material therein can be made by pressing a mixture of the glass powders or pellets and the phosphor material which are packed in the opening of the lid. A glass paste can be used instead of the glass powders or pellets.

In the configuration that the phosphor material is bound on the rear surface, an organic material and inorganic material can be used as a binder material. It is to be understood that the present invention is not intended to be limited to the binder material.

Epoxy resins, acrylate resins and silicone resins which are weather-proof transparent resins preferably may be used for the organic materials of binder. Specially, the silicone resin is preferable in improving the reliability of the device and improving the dispersibility for the phosphor material. The light emitting device which is not destroyed easily by thermal shock can be obtained by using an elastomer or gel like materials as a binder.

The inorganic materials of which thermal expansion coefficient are similar to that of the material of the window preferably may be used so as to bind the phosphor material on the window tightly. The settling method and the sol-gel method can be used for that binding. For example, the phosphor material may be fixed by forming the $SiO_2$ layer including the phosphor material by firing the slurry jetted on the window from the nozzle. The slurry can be made by mixing the phosphor material, silanol($Si(OEt)_3OH$) and ethanol.

An inorganic material can be used as a binder. In this case, the binder agent is a low melting point glass fine particle. The material of the glass particles preferably does not absorb the light having a wavelength in a range of from ultra violet to visible region and preferably may be stable in the binder. The fine particles of Borate of alkaline earth made by the settling method are preferable.

In the case of using the phosphor particles of large particle size, the binder agent preferably may be ultra fine particles rather than low melting point particles. For example, Silica of DEGUSA, Alumina, fine particles of pyrophoshate or orthophosphate of alkaline earth preferably may be given as a binder agent.

Next, a way of applying the binder agent is described. A slurry of the binder agent preferably may be used for exhibiting the binding effect sufficiently. The slurry is made by wet milling the binder agent in a vehicle. The vehicle is a viscous solution obtained by dissolving a bond in an organic solvent or a deionized water. For example, an organic vehicle can be obtained by dissolving Nitro-cellulose (1 wt %) in Butyl acetate solvent.

A paint can be made by mixing the phosphor material in the slurry of the binder agent. The contents of the phosphor material preferably may be set so that the ratio of the binder agent relative to the phosphor material is in a range of 1-3 wt %. If the ratio of the binder agent is too large, the light flux maintenance factor tends to go down.

In the case that the phosphor material is fixed on the rear surface of the lid with the binder agent, the paint is applied on the rear surface and dried by blowing the hot air or warm air and then baking at a temperature in a range of 400° C.-700° C. to evaporate the vehicle. With this, a phosphor layer which is bonded on the surface of the lid by the bonding agent is formed.

<Dispersing Agent>

In the present invention, the color conversion member may include a dispersing agent with the phosphor material. Barium titanate, Titanium oxide, Aluminum oxide and Silicon dioxide preferably may be given as a dispersing agent. With this, the light emitting device having a desired directional pattern can be obtained.

The dispersing agents are understood particles of which center particle size is in a range of 1 nm-5 μm in the specification. The particles of which center particle size is in a range of 1 μm-5 μm can control an irregular color, which caused by using large size phosphor particles, by irregular reflection. The dispersing agents can reduce half-width, so the light emitting device having a good color purity can be obtained. On the other hand, the particles of which center particle size is in a range of 1 nm-1 μm can enhance a viscosity of resin without decreasing the transparency of the resin and the brightness of the device, although those particles interfere with the light emitted by the light emitting element a little. With this, the particles of which center particle size is in a range of 1 nm-1 μm can maintain a state that the phosphor particles are dispersed uniformly in the resin in the syringe, and the productivity can be improved even if the large sized phosphor particles which are hard to handle are used. The dispersing agents have the rolls different from each other, which are corresponding to the particle size ranges respectively, so the particle size ranges of the dispersing agents may be selected according to the purposes.

<Filler>

In the present invention, fillers may be included in the color conversion layer. The filler is similar to the dispersing agents in material and different from the dispersing agents in particle size. The fillers are understood particles of which center particle size is in a range of 5 μm-100 μm in the specification. In the case that such particle sized fillers are included in the transparent resin, the chromaticity variation of the light emitting device and a resistant for thermal shock can be improved. Therefore, it can be prevented to break of the wire and to be exfoliated the light emitting element from the bottom of the recess, so the light emitting device having a good reliability can be obtained. Moreover, it is possible to maintain an even flowability of the resin for a long time, so the productivity can be improved.

The fillers preferably should have a particle size and/or a shape similar to the phosphor particles. The similar particle sizes mean that the difference between the those center particle sizes is less than 20%. The similar shapes mean that the difference between circular degrees which are a degree of difference from the complete round is less than 20%. The "circular degree" is defined as "the length of the circumference of the complete round having an area similar to the projected area of the particle/the length of the circumference of the projection of the particle". Such fillers can make the phosphor particles to disperse uniformly in the resin, so the fillers can control an irregular color. Moreover, the phosphor particles and the fillers preferably should have particle sizes set in a range of 15 μm-50 μm, more preferably in a range of 20 μm-50 μm so as to be dispersed with desired distances. With this, the routes for outputting the light can be secured sufficiently, so the directional pattern can be improved without decreasing the luminous intensity.

The invention will be understood in detail with reference to the following examples. However, these examples are not to be construed to limit the scope of the invention.

EXAMPLE 1

Figure 1A:
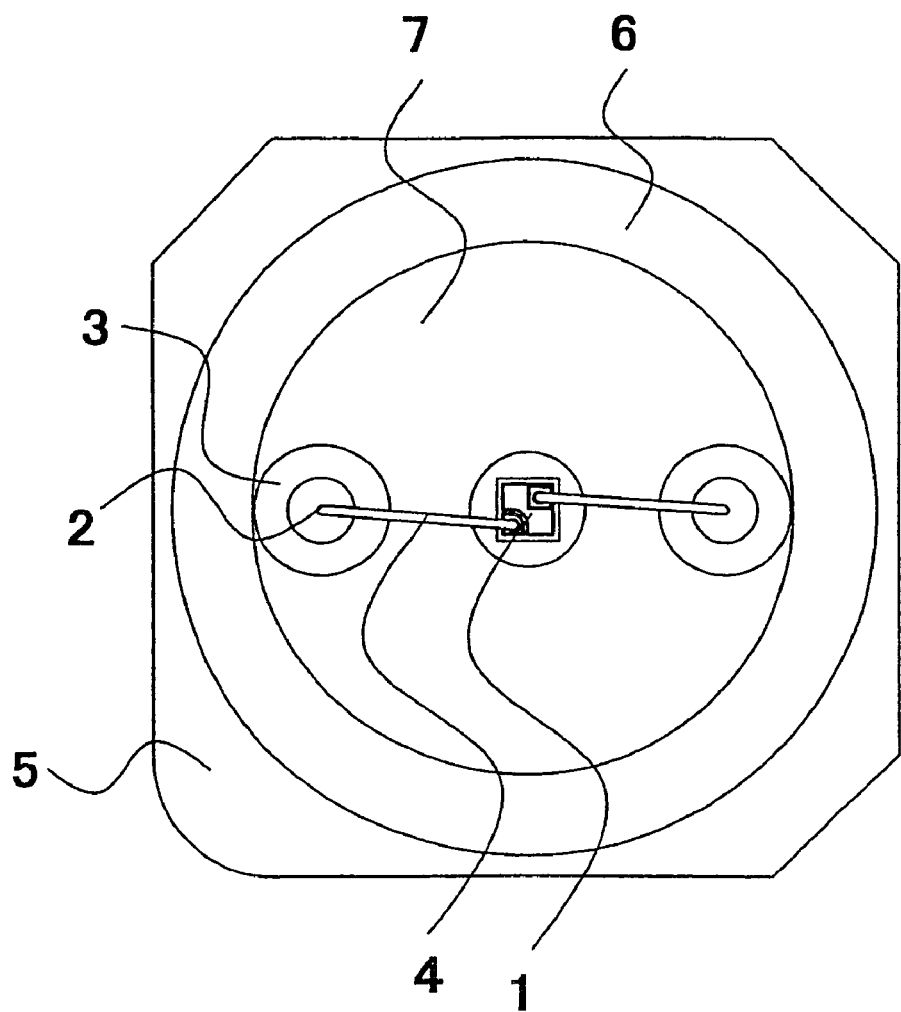
FIGS. 1A and 1B are respectively a schematic plan view and a schematic sectional view of a light emitting device of the present invention.
Figure 1B:
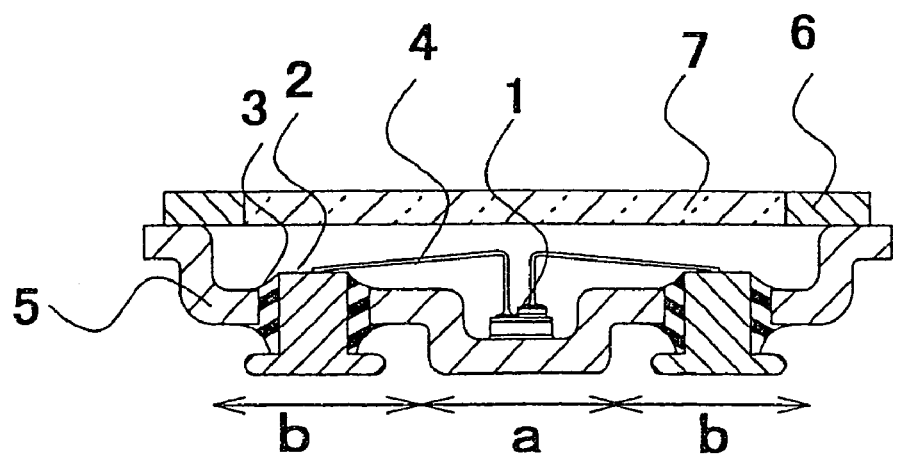

The light emitting device of surface mounting type shown in FIGS. 1A and 1B is made. The LED chip is a nitride semiconductor device having an active layer made of $In_{0.2}Ga_{0.8}N$ of which peak wavelength is 475 nm in visible light. The LED chip is produced by growing the nitride semiconductors on a sapphire substrate by MOCVD method using TMG(trimethyl-gallium) gas, TMI(trimethyl-indium) gas, nitrogen gas, dopant gas and carrier gas. The n-type nitride semiconductor can be made using the $SiH_4$ gas as a dopant gas and p-type nitride semiconductor can be made using the $Cp_2Mg$ as a dopant gas.

The LED chip has a structure constituted by laminating an n-type GaN layer of undoped nitride semiconductor, an n-type GaN (doped with Si) layer which is a contact layer for forming an n-type electrode, an n-type GaN layer of undoped nitride semiconductor and a light emitting layer in turn on a sapphire substrate. The light emitting layer is a multi quantum well structure composed of five well layers of InGaN and barrier layers of GaN formed on both sides of each well layer so as to sandwich the well layer. A Mg-doped AlGaN layer which is a cladding layer and a Mg-doped GaN layer which is a p-type contact layer are laminated on the light emitting layer. A buffer layer of GaN grown at a lower temperature is formed on the sapphire substrate. P-type semiconductors are annealed at 400° C.

The surfaces of the p-type and n-type contact layers are exposed at the same side by etching. Positive and negative pedestal electrodes are formed on the exposed surfaces of the p-type and n-type contact layers by sputtering. In detail, the positive pedestal electrode is formed on a metal thin film formed on the surface of the p-type semiconductor layer as a transparent electrode. The LED chips are completed by dividing the semiconductor wafer on which a lot of light emitting elements are formed by scribing.

A covar package composed of a base part having a recess in center thereof and two lead electrode pins of covar is used. The two lead electrode pins are penetrating the base part and are fixed so as to be sealed hermeticaly and insulatedly. The surfaces of the package and the lead electrode pins are covered with Ni/Ag layers.

The LED chip is die-bonded in the recess with an alloy of Ag—Sn. According to Example 1 aforementioned above, the light emitting device having an extremely high reliability can be obtained because all parts are made of inorganic materials.

In the present invention, the resin including conductive bodies and glass may be used as a bonding member for die-bonding instead of the alloy. The conductive bodies preferably should be Ag. The heat generated by the LED chip can be radiated efficiently and a stress generated at the bonding part can be decreased by using an Ag paste including Ag in a range of 80%-90%.

The electrodes of the LED chip are bonded electrically with the exposed surfaces of the lead electrode pins at the bottom of the recess by Ag-wires after die-bonding. The light emitting device of Example 1 includes no organic member as parts, so Al wires may be used.

A covar lid having a window center thereof is fixed to seal the recess by seam welding after moisture is exhausted in the recess.

In the light emitting device of Example 1, the output power will not change even if a forward current(If) of 500 mA have been continued to flow for 500 hours, so the light emitting device of Example 1 can maintain a high power output by large current for a long time.

EXAMPLE 2

A light emitting device of Example 2 is the same as the light emitting device of Example 1 except that a package of iron of which base part has a thicker thickness than that of the bottom part of the recess is used instead of the covar package. In the light emitting device of Example 2, the heat generated by the light emitting element can be radiated more efficiently than Example 1. Moreover, the light emitting device of Example 2 has a mechanical strength higher than that of the light emitting element of Example 1. Therefore, the reliability and the productivity are improved, so the light emitting device which can maintain a high power output by large current for a long time can be produced with good productivity.

EXAMPLE 3

Figure 4:
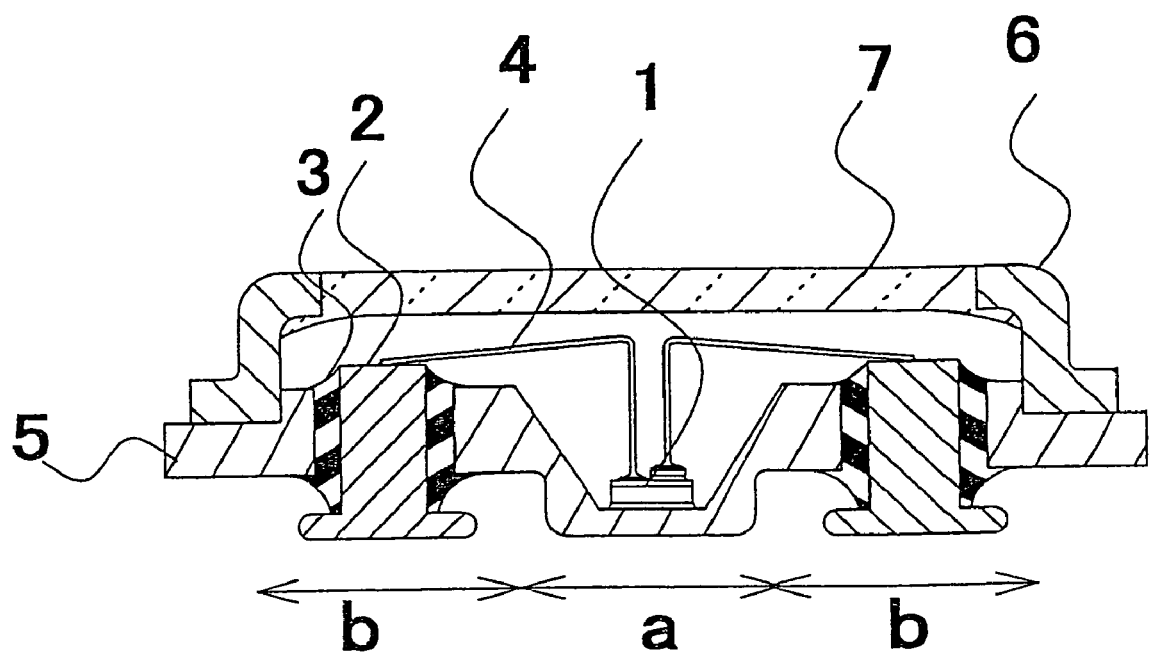
FIG. 4 is a schematic sectional view of another light emitting device of the present invention.

A light emitting device of Example 3 is the same as the light emitting device of Example 2 except that a package of iron of which recess has a tapered inner wall (shown in FIG. 4) is used. In the light emitting device of Example 3, the mechanical strength and the output power of emitted light can be improved 15%.

EXAMPLE 4

A light emitting device of Example 4 is the same as the light emitting device of Example 3 except that a lid of which window is formed in convex lens shape is used.

In the light emitting device of Example 4, the front luminous intensity can be improved 50% compared to Example 3.

EXAMPLE 5

A light emitting device of Example 5 is the same as the light emitting device of Example 3 except that a lid of which window includes a phosphor material is used.

The phosphor material of Example 5 is made by the following process.

A solubilized solution which is obtained by dissolving the rare earth elements of Y, Gd, Ce in an acid at a stoichiometric ratio is co-precipitated with oxalic acid and then the co-precipitated product is baked to obtain a co-precipitated oxide. Then, the co-precipitated oxide and aluminum oxide are mixed to obtain a mixed raw material. The mixed raw material is mixed with Barium fluoride as a flux and the mixture is packed in a crucible and fired at a temperature of 1400° C. in air for 3 hours to obtain a fired product. The fired product is pulverized in water by a ballmill, washed, separated, dried and finally sieved to obtain the phosphor particles of which center particle size is 22 cm. The phosphor is represented by $(Y_{0.995}\ Gd_{0.005})_{2.750}Al_5O_{12}$:$Ce_{0.250}$.

The phosphor particles are mixed with Silica powder in 1:2 and the mixture is compacted in the opening of the lid by pressing. The color conversion type light emitting device of Example 5 has effects similar to Example 1 and is capable of emitting a white color light with high power.

EXAMPLE 6

A light emitting device of Example 6 is the same as the light emitting device of Example 3 except that the color conversion part is formed as follows.

The phosphors are added in a slurry consisting of 90 wt % of nitrocellose and 10 wt % γ-alumina and the slurry containing the phosphor is coated on the back face of the window of the lid. It is cured by heating at 220° C. for 30 minutes, and then, the color conversion part is formed.

The color conversion type light emitting device of Example 6 has effects similar to Example 5.

EXAMPLE 7

A light emitting device of Example 7 is the same as the light emitting device of Example 6 except that a silicone resin is used instead of the slurry.

The color conversion type light emitting device of Example 7 has effects similar to Example 6.

EXAMPLE 8

A light emitting device of Example 8 is the same as the light emitting device of Example 6 except that a silica gel is used instead of the slurry.

The color conversion type light emitting device of Example 8 has effects similar to Example 6.

EXAMPLE 9

A light emitting device of Example 9 is the same as the light emitting device of Example 3 except that a silicone resin containing the phosphor particles is packed in the recess of the package. In the light emitting device of Example 9, the front luminous intensity can be improved in comparison with Example 5.

In the light emitting device of Example 9, the light emitting element is covered with the resin, so a point-like source of light is changed to a surface light source and colors are mixed sufficiently. Therefore, uniform surface light emitting without changing the color depending on the directions can be obtained. In a case that an elastomer silicone or a gel silicone are used as a silicone resin, a light emitting device having a good heat-resisting and good reliability can be obtained.

EXAMPLE 10

Figure 9A:
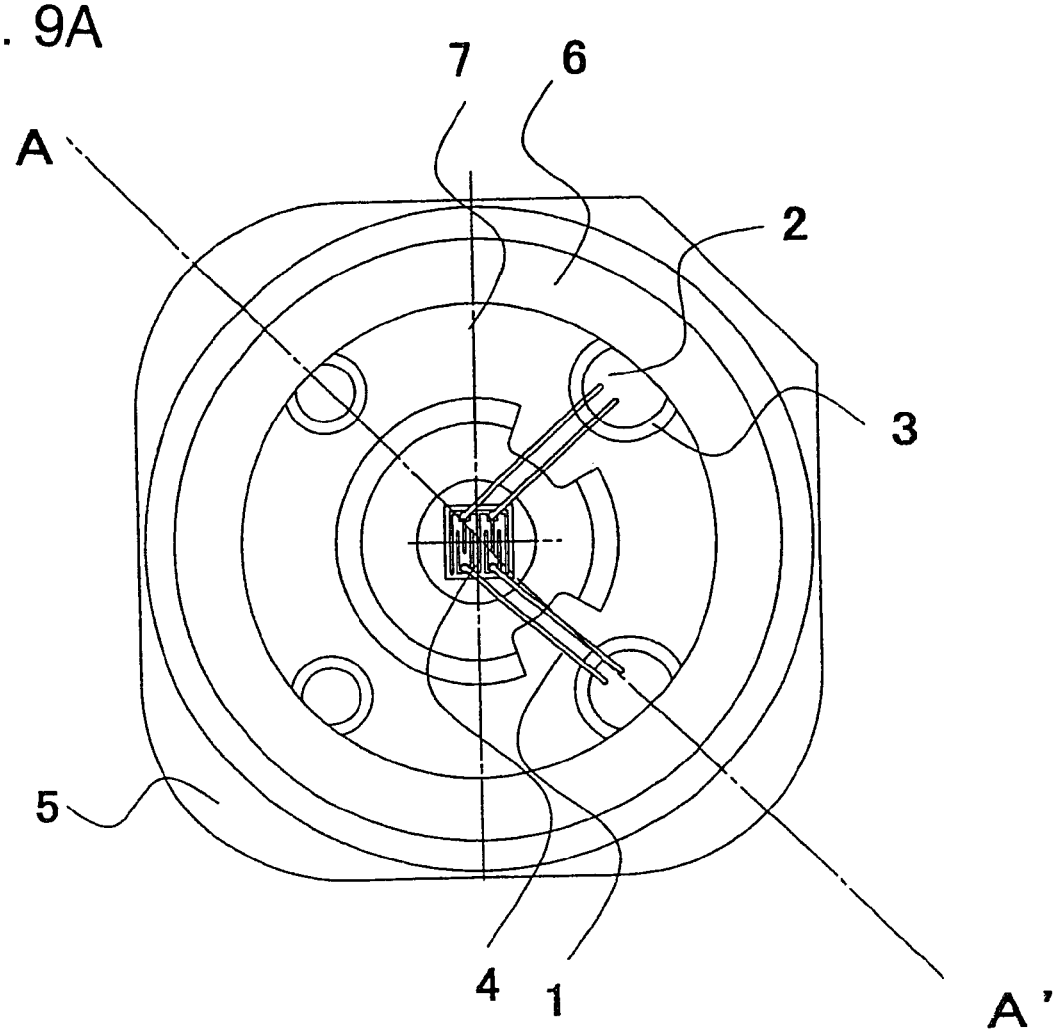
FIG. 9A is a schematic plan view of another light emitting device of the present invention.
Figure 9B:
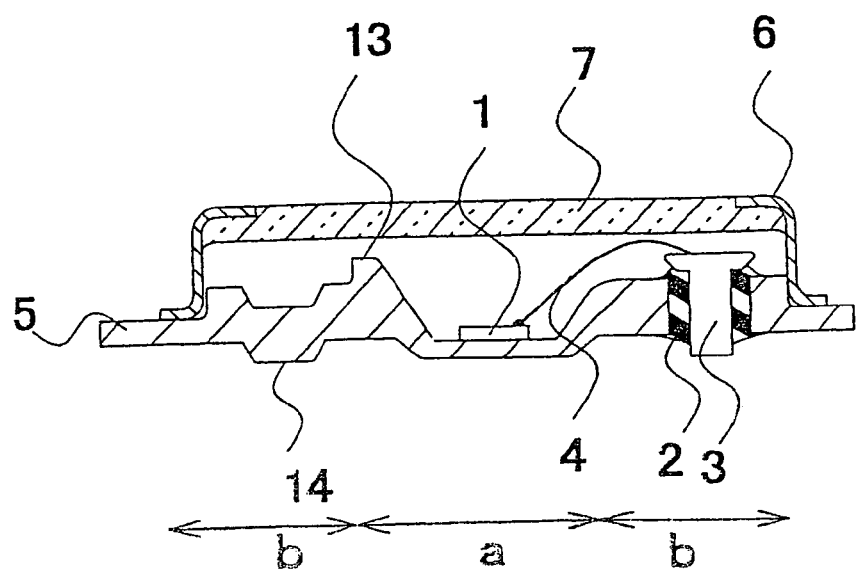
FIG. 9B is a schematic sectional view taken on line A-A' of FIG. 9A.

A surface mounted type light emitting device is made as shown in FIGS. 9A and 9B. The package shown in FIGS. 9A and 9B has a recess (a) and a base part (b) surrounding the recess. The recess has a tapered inner wall 13, a bottom plate having a thickness less than that of the base plate and an edge part projected from base part. The package formed of the base part and the recess part monolithcaly is made by flowing an iron base plate on a metallic mold having a tapered recess by drawing. The package makes it possible to produce a light emitting device, which has a good reliability and is capable of outputting the light emitted from the light emitting element efficiently, easily.

Two through holes penetrating in the direction of thickness are made in the base part surrounding the recess.

Lead electrode pins of covar are made in T-like shapes in cross section so that an area of the main face is larger than that of bottom surface. The surfaces of the lead electrode pins are plated with Ni/Au. The lead electrode pins are inserted in the through holes respectively. When the lead electrode pins are inserted in the through holes, the lead electrode pins in T-like shapes can be positioned easily, so the lead electrode pins can be fixed accurately in positioning. Next, the lead electrode pins are fixed with a fixture of carbon having a crevice for fastening and then glass pastes are applied between the through holes and the lead electrode pins and then the glass pasts applied are melted to seal hermetically. The lead electrode pins can be fixed stably with the fixture by the large main surface, so hermetic sealing is made surely. In the light emitting device of Example 10, the package is sealed with nitrogen gas hermetically. Therefore, since the metal migration is prevented, the area of the main surfaces of the lead electrode pins can be increased. With this, after the main surfaces of the lead electrode pins are bonded with wires by stitch bonding, the bonding parts can be reinforced by metal pieces. In detail, a wire (first wire) is bonded on the main surface of the electrode pin (first stitch bonding) and then a reinforcement ball is formed by bonding another wire (second wire) so as to cover at least a part of the first stitch bonding part. Then, the second wire is risen and moved in the direction opposite to the first wire so as to cover the first stitch bonding part, and then a second stitch bonding is done with the second wire, and then the second wire is cut. The reinforcement metal piece (reinforcement ball=second ball bonding part), the first bonding part and the second bonding part are arranged on one line. Therefore, since the bonding part as a whole is loaded and subjected with ultrasonic vibration for three times, the wires can be bonded strongly to the lead electrode pin. The first stitch bonding part and the second stitch bonding part preferably should be positioned symmetrically to the reinforcement metal piece so as to form the second ball bonding part with uniform thickness. With this, since the load and the ultrasonic vibration in the second stitch bonding are added on all the bonding part uniformly, the strength of the bonding can be enhanced. The good reliability is ensured by reinforcement of bonding even if the bonding condition is not good.

Moreover, two or more wires can be bonded on one lead electrode pin, since the area of the surface of the lead electrode pin is large. A large sized light emitting element can emit the light with large power by applying the large current. The electrodes of such large sized light emitting element preferably should be bonded with two or more wires to prevent the wires from breaking by the heat generated by the light emitting element and the wires. Such a large sized light emitting element can be mounted on the package of Example 10 with good reliability by bonding with two or more wires. In the case that a protective element is used for protecting the light emitting element from electrostatic failure, it is necessary that each electrode pin is bonded with the protective element and the light emitting element with at least two wires. The package of Example 10 makes it possible to produce the light emitting device including the protective element and the light emitting element in one package with good productivity and good reliability. On the other hand, an area of the bottom surface should be small to prevent the migration. In Example 10, the lead electrode pins are arranged along with one side edge, so the electrode pattern of a printed circuit board can be simplified and a region for radiating the heat can be enlarged. The mounting patterns can be increased. In the case that the protective element is used, the protective element preferably should be arranged between the lead electrode pins to shorten the wires for connecting to the lead electrode pins. With this, the reliability can be raised without spoiling the optical characteristics.

The main surface of the edge part of the recess and the main surfaces of the lead electrode pins preferably should be positioned on a same plane to raise an accuracy of bonding and to obtain the thin-type light emitting device having a good reliability. In the edge part of the recess, the main surfaces which are positioned between the recess and the lead electrode pins preferably should be lower than the main surface of the base part and the edge of the recess preferably should be formed in round shape. With this, the loop height of the wires can be lowered, so it is possible to raise the brightness and to realize a thin device. Such an edge part having a lowered surface can be made monolithically by pressing to form the recess.

Figure 10:
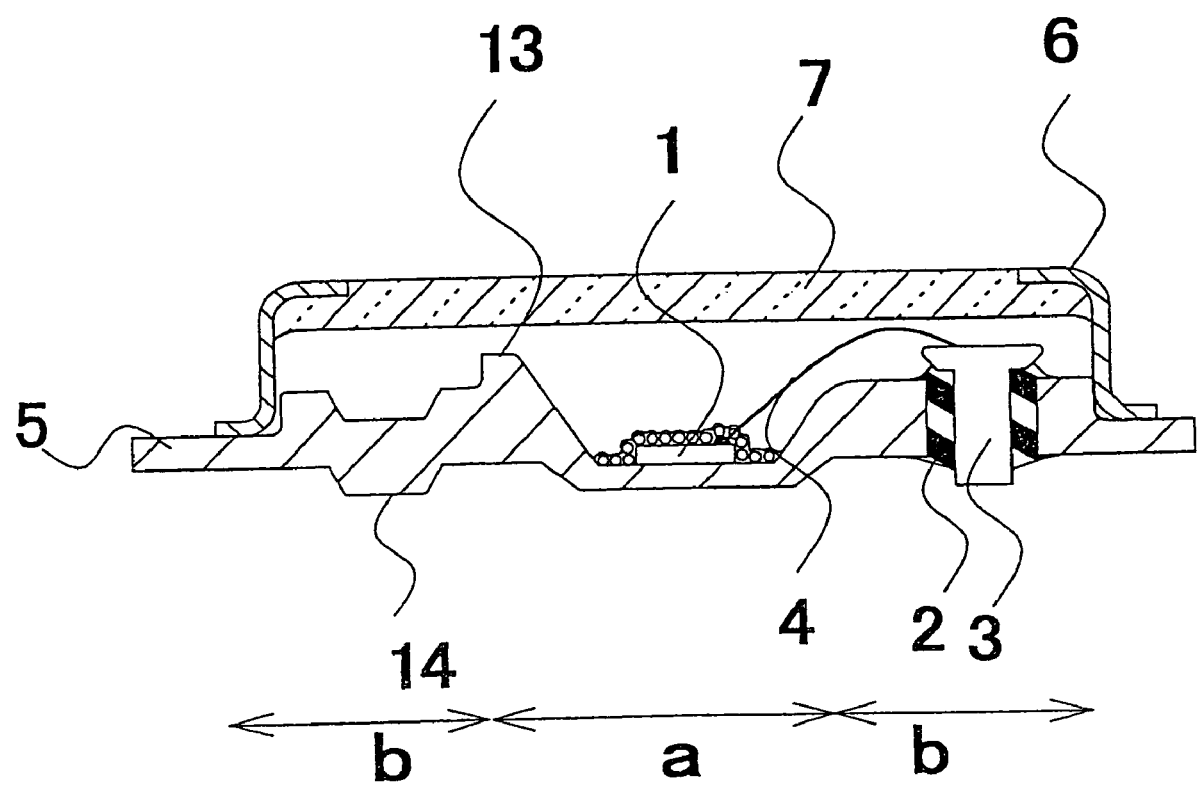
FIG. 10 is a schematic sectional view of another light emitting device of the present invention.

Two supporting parts 14 (FIGS. 9A-10) opposite to the lead electrode pins are formed at the base part by pressing so that the metal flows from the main surface to bottom surface. The bottom faces of the supporting parts are positioned on the same plane including the bottom surface of the lead electrode pins and the bottom surfaces of the recess. With this, a light emitting device with good mountability and good heat radiating characteristic can be obtained.

An LED chip which has two positive electrodes and two negative electrodes is die-bonded in the recess of the package with Ag—Sn alloy. The LED chip preferably should be arranged so that the side face emitting the light is opposed to the projected edge part of the recess. In other words, the LED chip is arranged so that the corners of the light emitting element is opposed to the lead electrode pins. With this arrangement, a thin light emitting device can be realized without lowering the light output efficiency. The two positive electrodes of the LED chip are connected to the main surface of the one electrode pin with Au wires and the two negative electrodes of the LED chip are connected to the main surface of the other electrode pin with Au wires. Although, the LED chip having two or more positive electrodes and two or more negative electrodes generates a large amount of heat, a high powered light emitting device can be realized without spoiling reliability by using the package having a good radiating characteristic according to Example 10. Since the area of the main surfaces of the lead electrode pins is large, each main surface can be bonded with two or more wires with good reliability. Since the lead electrode pins is arranged along with the one side, even if a large area of the main surface of the lead electrode pins are required, a large sizing of the device can be held at a minimum by expanding in the only one direction.

Next, the recess is sealed hermetically with the covar lid to protect the LED chip and the wires, after the humidity is removed from the recess and a nitrogen gas is introduced in the recess. The glass window preferably should be crossed lines extended from the inner wall of the recess. More preferably, the glass window (transparent window) is crossed a line that links a rising edge point of the inner wall of the recess and an ending edge point of the inner wall, which is opposing to the rising edge point so as to sandwich said light emitting element. With this, the light reflected or scattered from the inner wall can be outputted efficiently. The light emitting device of Example 10 has a higher mechanical strength and the higher output power than Example 3.

EXAMPLE 11

A light emitting device of Example 11 is the same as the light emitting device of Example 10 except for having a color conversion layer formed by a splay coating. The color conversion layer includes the phosphor of $(Y_{0.995}Gd_{0.005})_{2.750}Al_5O_{12}:Ce_{0.250}$ (same as Example 5) and $SiO_2$. The color conversion layer is formed as follow.

Step 1.

Although, a methyl-silicate, an ethyl-silicate, an N-propyl-silicate and an N-butyl-silicate may be used as an alkyl-silicate, a colorless and transparent liquid of oligomer made of condensation of an ethyl-silicate including $SiO_2$ at 40 wt % is used in Example 11. The ethyl-silicate is solated by hydrolyzing with water under a catalyst.

The liquid made by mixing the ethyl-silicate sol, ethylene glycol and the phosphor is agitated to adjust a paint. Although, the ethyl-silicate sol is easy to dry, the sol is prevented from gelling by mixing with an organic solvent such as an ethylene glycol or a butanol which have high boiling temperature. With this, the nozzle is prevented from clogging, so productivity is improved.

Step 2.

Figure 11:
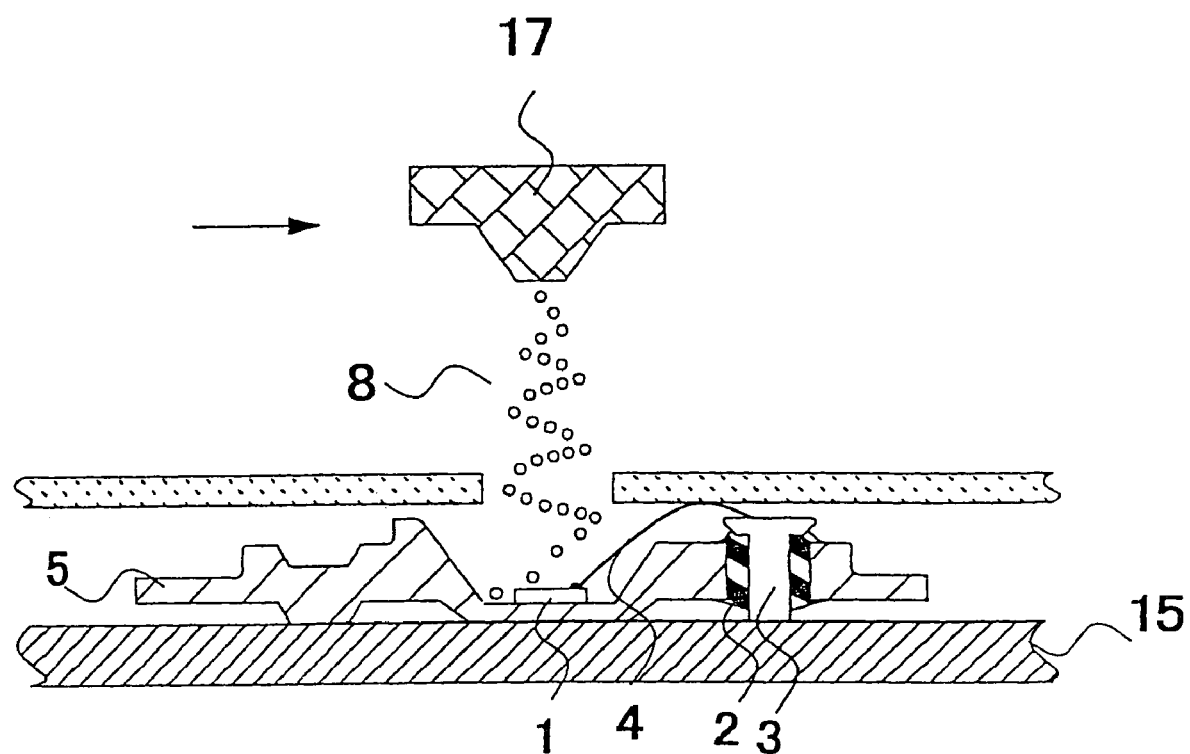
FIG. 11 is a schematic view of a step to produce the light emitting device shown in FIG. 10.
Figure 12:
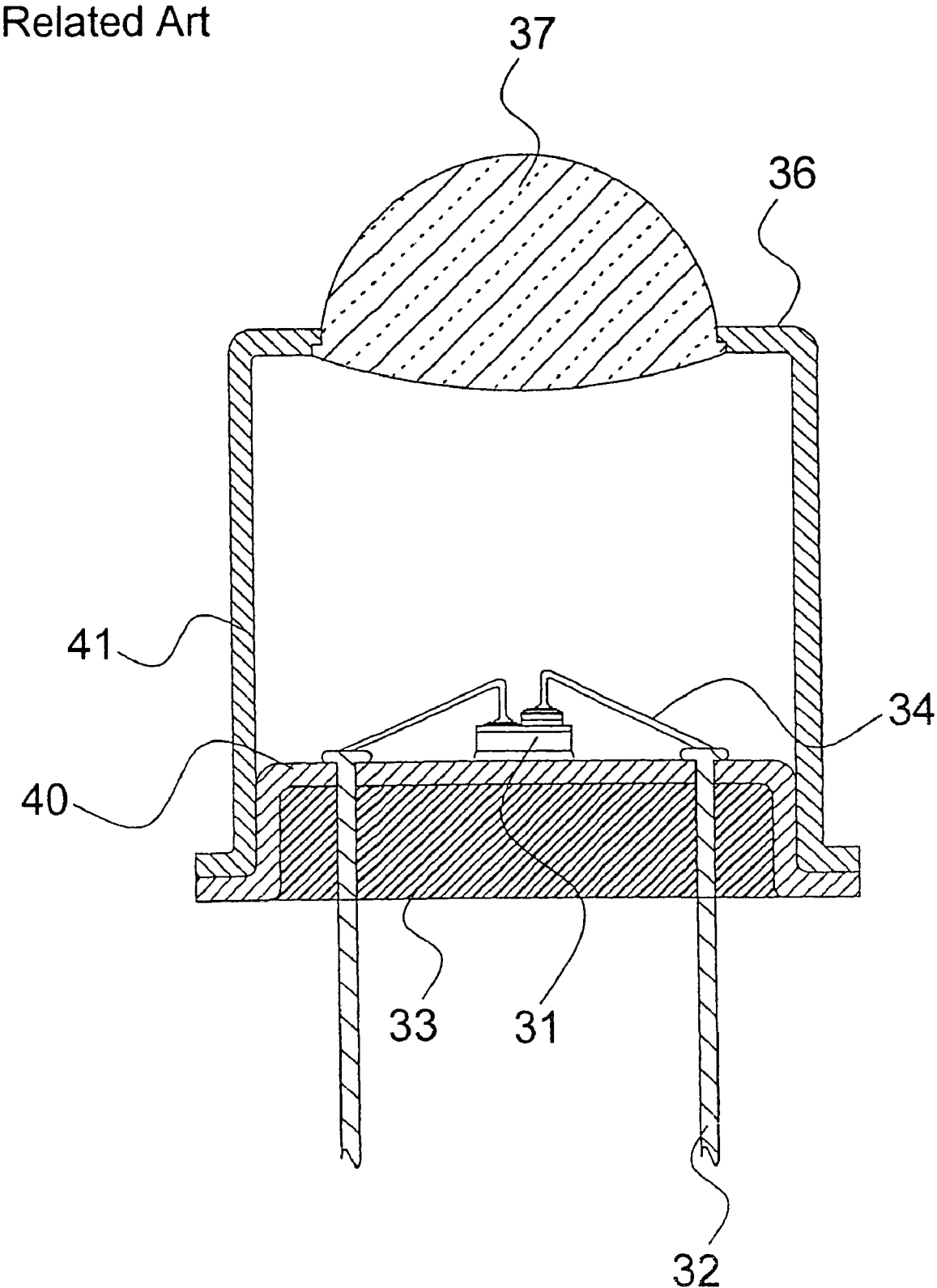
FIG. 12 is a schematic sectional view of a light emitting device according to a related art.
Figure 13:
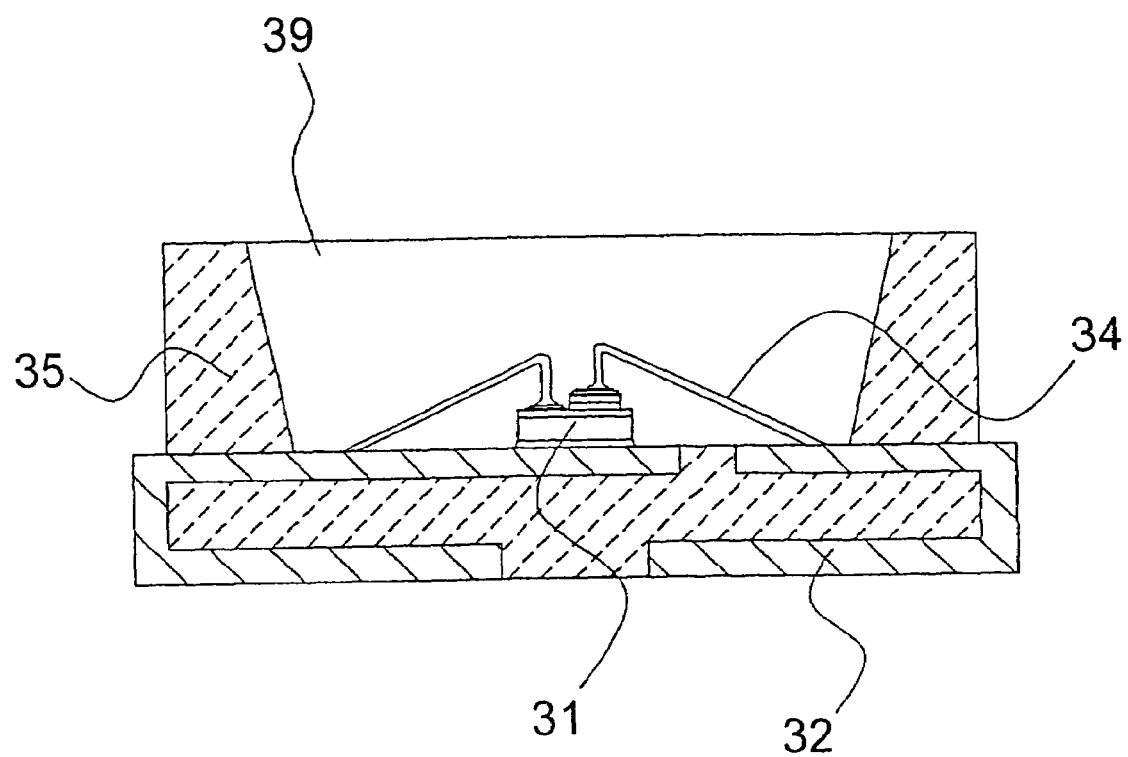
FIG. 13 is a schematic sectional view of another light emitting device according to a related art.
Figure 14:
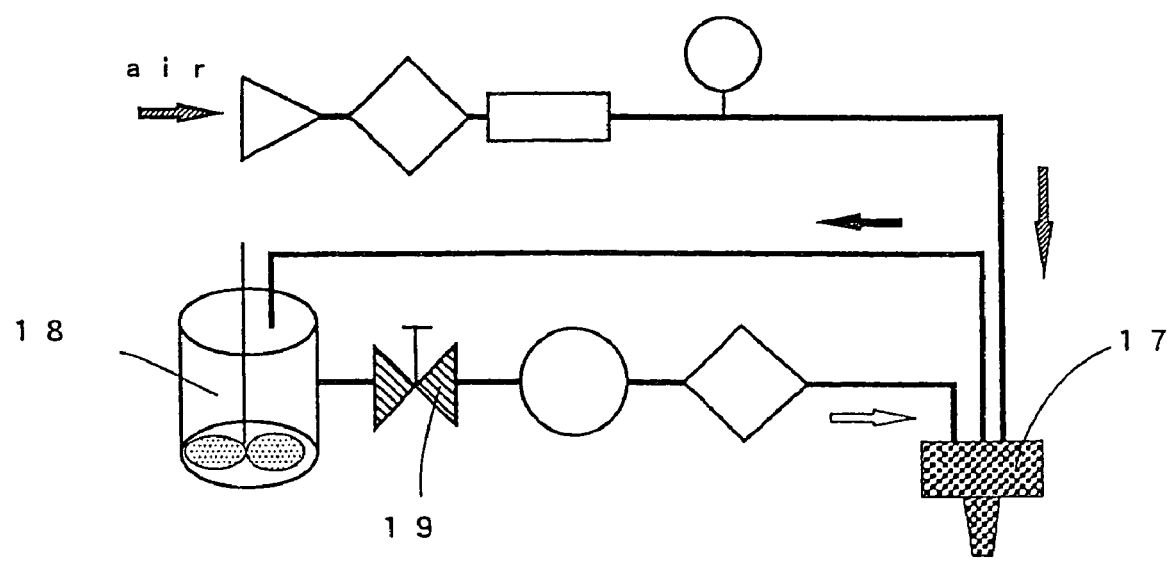
FIG. 14 is a schematic view of an apparatus used in a step to produce the light emitting device shown in FIG. 10.

The adjusted paint is introduced in the container 18 and then conveyed to the nozzle 17 as shown in FIGS. 11 and 14. The flowing rate of the adjusted paint is adjusted by valve 19. The atomized paint is jetted from the nozzle 17 so as to rotate helically. Concretely, the jetted paint spreads in cone shape near the nozzle and in column shape apart from the nozzle. With this, the color conversion layer can be formed so as to cover all of the upper face, side faces and corners of the light emitting element with uniform thickness, so the irregular color such as a blooming can be suppressed. The color conversion layer preferably should be a layer in which the particles are arranged on a plane without overlapping each other to increase the light outputting efficiency. In Example 11, the distance between the edge of the nozzle and the upper surface of the light emitting element is set in a range of 40-50 mm so that the jetted paint in column shape is applied on the surface of the light emitting element. With this arrangement, the color conversion layer having an even thickness can be formed continuously on the upper surface, side surface and the corners of the light emitting element and the inner surfaces of the recess. The part to be applied with the paint (the surface of the light emitting element) preferably should be heated to momentarily evaporate the ethanol and the solvent when the paint is applied. With this, the color conversion layer can be formed without damaging the light emitting element. In Example 11, the paint is sprayed to the package put on a heater 15 (FIG. 11), so the temperature of the heater 15 should be set in a range of 50° C.-300° C.

Step 3.

The paint applied on the light emitting element and the recess leaves at the room temperature so that the ethyl-silicate react with the humidity of the air, so the phosphor particles fixed by $SiO_2$.

Step 4.

The $SiO_2$ layer including the phosphor particles is dried at 300° C. for two hours. The nitride semiconductor light emitting element is damaged at 350° C. or more. Therefore, the alkyl-silicate which can be treated at 300° C. is suited for fixing the phosphor particles.

The light emitting device of Example 11 has a good heat radiating characteristic and a good light resistance for the ultraviolet and near visible light because of including no organic materials. Therefore, in the device of Example 11, any light emitting elements including an ultra violet light emitting element can be used.

EXAMPLE 12

A light emitting device of Example 12 is the same as the light emitting device of Example 11 except for using phosphors having a first phosphor of $(Y_{0.995}Gd_{0.005})_{2.750}Al_5O_{12}$:$Ce_{0.250}$ and a second phosphor of $Ca_{1.8}Eu_{0.2}Si_5N_8$. The light emitting device of Example 12 is superior to Example 11 in color rendering property. While the present invention is not limited to the specific second phosphor, the second phosphor preferably should be a phosphor $M_xSi_yN_z$:Eu(where M is at least one alkaline earth metal selected from the group consisting of Ca, Sr, Ba and Zn, $z=(2/3)x+(4/3)y$), which can be excited by the light having a wavelength similar to the first phosphor and can emit a light in a range from yellow to red.

EXAMPLE 13

A light emitting device of Example 13 is the same as the light emitting device of Example 11 except for using a fluororesin instead of the ethyl-silicate. In the Example 13, the effects similar to Example 11 and a good productivity can be obtained.

EXAMPLE 14

A light emitting device of Example 14 is the same as the light emitting device of Example 11 except for using an LED chip of which main peak is at 400 nm and using a phosphor of $(Sr_{0.96}, Eu_{0.01}, Mn_{0.03})_{10}(PO_4)_6 C_{12}$ instead of the phosphor.

The phosphor of Example 14 is made by the following. The raw materials of $SrHPO_4$, $SrCO_3$, $Eu_2O_3$, $MnCO_3$ and $NH_4Cl$ are weighted to meet the formula ($SrHPO_4$:1000 g, $SrCO_3$:482.4 g, $Eu_2O_3$:16.0 g, $MnCO_3$:35.2 g, $NH_4Cl$:116.5 g) and are mixed.

The raw materials are mixed sufficiently by a ball mill in dry. The mixed raw materials are packed in a crucible and then fired in a reducing atmosphere of N2, H2 at 1200° C. for three hours. The rising rate up to 1200° C. is 960° C./hr. The fired materials are milled in the water and dispersed, sieved, separated, washed, dried to obtain the phosphor particles of Example 14. According to Example 14, the light emitting device capable of emitting the light with high intensity can be obtained.

EXAMPLE 15

A light emitting device of Example 15 is the same as the light emitting device of Example 14 except for using a phosphor of $(Ca_{0.93}, Eu_{0.05}, Mn_{0.02})_{10}(PO_4)_6 Br_{1.0}Cl_{1.0}$.

The raw materials of $CaHPO_4$, $CaCO_3$, $Eu_2O_3$, $MnCO_3$, $NH_4Cl$ and $NH_4Br$ are weighted to meet the formula of $(Ca_{0.93}, Eu_{0.05}, Mn_{0.02})_{10}(PO_4)_6 Br_{1.0}Cl_{1.0}$ and are mixed.

The raw materials are mixed sufficiently by a ball mill in dry. The mixed raw materials are packed in a crucible and then fired in a reducing atmosphere of $N_2$, $H_2$ at 1200° C. for three hours. The rising rate up to 1200° C. is 960° C./hr. The fired materials are milled in the water and dispersed, sieved, separated, washed, dried to obtain the phosphor particles of Example 15. According to Example 15, the light emitting device capable of emitting the light with high intensity can be obtained.

EXAMPLE 16

A light emitting device of Example 16 is the same as the light emitting device of Example 14 except for using phosphors having a first phosphor of $(Y_{0.995}Gd_{0.005})_{2.750}Al_5O_{12}$:$Ce_{0.250}$ and a second phosphor of $(Ca_{0.93}Eu_{0.05}Mn_{0.02})_{10}(PO_4)_6Br_{1.0}Cl_{1.0}$. According to Example 16, the light emitting device capable of emitting a white light with high intensity can be obtained.

EXAMPLE 17

A light emitting device of Example 16 is the same as the light emitting device of Example 14 except for using a first color conversion layer and a second color conversion layer on the first color conversion layer instead of the one color conversion layer. The color conversion layer is made by spraying a paint made of a phosphor of $(Ca_{0.93}Eu_{0.05}Mn_{0.02})_{10}(PO_4)_6Br_{1.0}Cl_{1.0}$ and $Al_2O_3$ on the surface of the light emitting element and the inner surface of the recess. The second color conversion layer is made by the way similar to Example 11 so that the phosphor of $Y_{0.995}Ga_{0.005})_{2.750}Al_5O_{12}$:$Ce_{0.250}$ is fixed with $SiO_2$ made from the ethyl-silicate sol. Since the refractive index of the first color conversion layer is larger than that of the second color conversion layer and smaller than that of the nitride semiconductor layer, the light outputting efficiency can be increased. Therefore, the light emitting device capable of emitting the light with high power can be obtained.

INDUSTRIAL APPLICABILITY

According to the present invention, the heat radiating efficiency is extremely improved and the high reliability can be maintained under the large current by using the metal package having a high reliability and contacting the part on which the light emitting light element is mounted with the printed circuit board. With this, the light emitting devices which can continue emitting light for a long time with high brightness similar to lighting, can be realized and the utility value on the industry is very high.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed:

1. A light emitting device comprising:
   a light emitting element;
   a metal package including a recess part for housing the light emitting element and a base part having at least one through hole; and
   at least one electrode pin in the at least one through hole and insulated from the base part of the metal package with an insulating member,
   wherein a bottom outer surface of the at least one through hole further defined by the insulating member is projected out from a bottom outer surface of the base part of the metal package,
   wherein a bottom outer surface of the recess part of the metal package is aligned with a bottom outer surface of the at least one electrode pin.

2. The light emitting device according to claim 1, wherein a top surface of the light emitting element is positioned lower than a top surface of the at least one electrode pin.

3. The light emitting device according to claim 1, wherein a thickness of the base part is thicker than a thickness of the recess part of the metal package.

4. The light emitting device according to claim 1, wherein the at least one through hole involves a plurality of through holes each having an electrode pin therein with a corresponding insulating member.

5. A light emitting device comprising:
a light emitting element;
a metal package including a recess part for housing the light emitting element and a base part having at least one through hole; and
at least one electrode pin in the at least one through hole and insulated from the base part of the metal package with an insulating member,
wherein a bottom outer surface of the at least one through hole further defined by the insulating member is projected out from a bottom outer surface of the base part of the metal package, and
wherein end portions of the metal package are bent upwardly.

6. The light emitting device according to claim 5, wherein a top surface of the light emitting element is positioned lower than a top surface of the at least one electrode pin.

7. The light emitting device according to claim 5, wherein a thickness of the base part is thicker than a thickness of the recess part of the metal package.

8. The light emitting device according to claim 5, wherein the at least one through hole involves a plurality of through holes each having an electrode pin therein with a corresponding insulating member.

9. A light emitting device comprising:
a light emitting element;
a metal package including a recess part for housing the light emitting element and a base part having at least one through hole; and
at least one electrode pin in the at least one through hole and insulated from the base part of the metal package with an insulating member,
wherein a bottom outer surface of the at least one through hole further defined by the insulating member is projected out from a bottom outer surface of the base part of the metal package, and
wherein the recess part projects out from the base part.

10. The light emitting device according to claim 9, wherein a top surface of the light emitting element is positioned lower than a top surface of the at least one electrode pin.

11. The light emitting device according to claim 9, wherein a thickness of the base part is thicker than a thickness of the recess part of the metal package.

12. The light emitting device according to claim 9, wherein the at least one though hole involves a plurality of through holes each having an electrode pin therein with a corresponding insulating member.

13. A light emitting device comprising:
a light emitting element;
a metal package including a recess part for housing the light emitting element and a base part having at least one through hole;
at least one electrode pin in the at least one though hole and insulated from the base part of the metal package with an insulating member; and
a lid covering the light emitting element,
wherein a bottom outer surface of the at least one through hole further defined by the insulating member is projected out from a bottom outer surface of the base part of the metal package,
wherein the lid is flat, and
wherein the lid has a metal part and a transparent window part.

14. The light emitting device according to claim 13, wherein the transparent window part includes a phosphor.

15. The light emitting device according to claim 13, wherein end portions of the lid contact end portions of the metal package to encapsulate the light emitting element.

16. A light emitting device comprising:
a light emitting element;
a metal package including a recess part for housing the light emitting element and a base part having at least one though hole;
at least one electrode pin in the at least one through hole and insulated from the base part of the metal package with an insulating member; and
a lid covering the light emitting element,
wherein a bottom outer surface of the at least one through hole further defined by the insulating member is projected out from a bottom outer surface of the base part of the metal package,
wherein the lid has been bent, and
wherein the lid has a metal part and a transparent window part.

17. The light emitting device according to claim 16, wherein the transparent window part includes a phosphor.

* * * * *